United States Patent
Aoyama et al.

(10) Patent No.: US 6,330,166 B1
(45) Date of Patent: Dec. 11, 2001

(54) ELECTRONIC-COMPONENT MOUNTING STRUCTURE

(75) Inventors: Masayuki Aoyama, Kariya; Yasuaki Matsunaga, Toyokawa; Tomoyuki Hiramatsu, Chiryu; Naoyuki Akita, Anjo; Koji Kondo, Toyohashi, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/399,166

(22) Filed: Sep. 20, 1999

(30) Foreign Application Priority Data

Sep. 29, 1998 (JP) .................................. 10-276080

(51) Int. Cl.$^7$ ...................................... H05K 7/02

(52) U.S. Cl. ............................ 361/760; 361/774; 29/840; 257/737; 257/738; 257/774; 257/778; 257/786; 174/260

(58) Field of Search ................................ 361/760, 792.5, 361/764, 774; 174/260, 52.2, 255; 257/690, 779, 737–738, 778, 774, 786, 780, 787; 29/840; 438/106, 108, 125

(56) References Cited

U.S. PATENT DOCUMENTS 5,729,896 * 3/1998 Dalal et al. ............................ 29/840
5,869,904 * 2/1999 Shoji ..................................... 257/779

FOREIGN PATENT DOCUMENTS 7-93306    10/1995  (JP).
7-321247   12/1995  (JP).
9-45733     2/1997  (JP).

OTHER PUBLICATIONS

"Design Consideration for a Flip–Chip Joining Technique" by P. Lin et al; Solid State Technology, vol. 13/No. 7; Jul. 1970; pp., 48–54.

"Enhancement of Thermal–Cycle Resistivity in Flip–chip Mounting of LSI Chips on Glass Substrates with Resin Coating" by F. Nakano et al; Proceedings of the 29th. Symposium on Semiconductors and Integrated Circuits Technology; Dec. 5,6, 1985; pp., 43–48 (w/partial Eng. trans.).

* cited by examiner

Primary Examiner—Jeffrey Gaffin
Assistant Examiner—Thanh Y. Tran
(74) Attorney, Agent, or Firm—Pillsbury Winthrop LLP

(57) ABSTRACT

In an electronic-component mounting structure, an electronic component (2) has a surface. First electrodes (1) provided on the surface of the electronic component (2) are arranged in a first array. Second electrodes (3) provided on a base board (4) are arranged in a second array corresponding to the first array. The second electrodes (3) correspond to the first electrodes (1) respectively. Solder bumps (9) connect the first electrodes (1) and the second electrodes (3) respectively. The first electrodes (1) include first outermost electrodes (1b) located in an outer area of the first array. The second electrodes (3) include second outermost electrodes (3b, 3c) located in an outer area of the second array. The second outermost electrodes (3b, 3c) correspond to the first outermost electrodes (1b) respectively. An outer edge (X1, Z1) of each of the second outermost electrodes (3b, 3c) extends outward of an outer edge (Y1) of a corresponding first outermost electrode (1b) with respect to the first and second arrays. A distance between an outer edge (X1, Z1) of each of the second outermost electrodes (3b, 3c) and an outer edge (Y1) of a corresponding first outermost electrode (1b) is greater than a distance between an inner edge (X2, Z2) of the second outermost electrode (3b, 3c) and an inner edge (Y2) of the corresponding first outermost electrode (1b) with respect to the first and second arrays.

18 Claims, 17 Drawing Sheets

ELECTRONIC-COMPONENT MOUNTING STRUCTURE

BACKGROUND OF THE INVENTION

1. Field of the Invention

This invention generally relates to a structure in which an electronic component and a base board are connected by an array of solder bumps provided on one surface of the electronic component. This invention particularly relates to an electronic-component mounting structure suited for use in a portable electronic apparatus.

2. Description of the Related Art

There are known techniques for increasing the life time of interconnecting solder bumps in BGA-package (ball grid array package) mounting structures.

Japanese published unexamined patent application 7-321247 discloses a BGA-package mounting structure. In Japanese application 7-321247, electrodes in an array on one side of a BGA package have elliptical shapes whose major axes correspond to dimensions along lines passing through the centers of deformations caused by thermal distortions. In addition, electrodes in an array on a base board have elliptical shapes substantially equal to those of the package electrodes. The package electrodes and the base-board electrodes are connected by solder balls. The BGA-package mounting structure in Japanese application 7-321247 suppresses the adverse affection of thermal distortions on the interconnecting solder balls, and thereby increases the life time of the interconnecting solder balls.

In general, a portable electronic apparatus is sometimes subjected to a mechanical shock. For example, when the portable electronic apparatus is accidentally dropped, such a mechanical shock occurs. Conventional solder bumps tend to be damaged by 5 mechanical shocks. Thus, it is desirable that portable electronic apparatuses use solder bumps which withstand mechanical shocks.

In the BGA-package mounting structure of Japanese application 7-321247, since the package electrodes and the base-board electrodes are substantially equal in shape, the solder bumps (the solder balls) have barrel-like shapes of FIG. 33 after a reflowing process is complete. The barrel-like solder bumps have such angles of contact with the electrodes that stresses tend to be applied to the bumps by mechanical shocks. Thus, it seems that the interconnecting solder bumps in the BGA-package mounting structure of Japanese application 7-321247 are easily damaged by mechanical shocks.

Japanese published unexamined patent application 9-45733 discloses a method of mounting electronic components. According to the method in Japanese application 9-45733, electrodes on an electronic component are connected to electrodes on a base board by solder bumps. After a reflowing process is complete, some of the interconnecting solder bumps have drum-like shapes with constricted middle portions as shown in FIG. 34. The constricted middle portions cause low strengths of the interconnecting solder bumps. Thus, the interconnecting solder bumps in Japanese application 9-45733 seem to be short in life time.

SUMMARY OF THE INVENTION

It is an object of this invention to provide an improved electronic-component mounting structure.

A first aspect of this invention provides an electronic-component mounting structure comprising an electronic component (2) having a surface; first electrodes (1) provided on the surface of the electronic component (2) and arranged in a first array; a base board (4); second electrodes (3) provided on the base board (4) and arranged in a second array corresponding to the first array, the second electrodes (3) corresponding to the first electrodes (1) respectively; and solder bumps (9) connecting the first electrodes (1) and the second electrodes (3) respectively; wherein the first electrodes (1) include first outermost electrodes (1b) located in an outer area of the first array, and the second electrodes (3) include second outermost electrodes (3b, 3c) located in an outer area of the second array, the second outermost electrodes (3b, 3c) corresponding to the first outermost electrodes (1b) respectively; wherein an outer edge (X1, Z1) of each of the second outermost electrodes (3b, 3c) extends outward of an outer edge (Y1) of a corresponding first outermost electrode (1b) with respect to the first and second arrays; and wherein a distance between an outer edge (X1, Z1) of each of the second outermost electrodes (3b, 3c) and an outer edge (Y1) of a corresponding first outermost electrode (1b) is greater than a distance between an inner edge (X2, Z2) of the second outermost electrode (3b, 3c) and an inner edge (Y2) of the corresponding first outermost electrode (1b) with respect to the first and second arrays.

A second aspect of this invention provides an electronic-component mounting structure comprising an electronic component (2) having a surface; first electrodes (1) provided on the surface of the electronic component (2) and arranged in a first array; a base board (4); second electrodes (3) provided on the base board (4) and arranged in a second array corresponding to the first array, the second electrodes (3) corresponding to the first electrodes (1) respectively; and solder bumps (9) connecting the first electrodes (1) and the second electrodes (3) respectively; wherein the first electrodes (1) include first outermost electrodes (1b) located in an outer area of the first array, and the second electrodes (3) include second outermost electrodes (3b, 3c) located in an outer area of the second array, the second outermost electrodes (3b, 3c) corresponding to the first outermost electrodes (1b) respectively; and wherein an angle ($\theta 1$) between a surface of each of the second outermost electrodes (3b, 3c) and a surface of a corresponding solder bump (9) at an outer edge (X1, Z1) of the second outermost electrode (3b, 3c) is acute, and is different from an angle ($\theta 2$) between a surface of the second outermost electrode (3b, 3c) and a surface of the corresponding solder bump (9) at an inner edge (X2, Z2) of the second outermost electrode (3b, 3c) with respect to the first and second arrays.

A third aspect of this invention is based on the second aspect thereof, and provides an electronic-component mounting structure wherein the first electrodes (1) have a greater strength of bond to the solder bumps (9) than a strength of bond between the second electrodes (3) and the solder bumps (9).

A fourth aspect of this invention provides an electronic-component mounting structure comprising an electronic component (2) having a surface; first electrodes (1) provided on the surface of the electronic component (2) and arranged in a first array; a base board (4); second electrodes (3) provided on the base board (4) and arranged in a second array corresponding to the first array, the second electrodes (3) corresponding to the first electrodes (1) respectively; and solder bumps (9) connecting the first electrodes (1) and the second electrodes (3) respectively; wherein the first electrodes (1) have a greater strength of bond to the solder bumps (9) than a strength of bond between the second electrodes (3) and the solder bumps (9); wherein the first electrodes (1) include first outermost electrodes (1b) located in an outer area of the first array, and the second electrodes (3) include second outermost electrodes (3b, 3c) located in an outer area of the second array, the second outermost electrodes (3b, 3c) corresponding to the first outermost electrodes (1b) respectively; and wherein an outer edge (X1, Z1) of each of the second outermost electrodes (3b, 3c) extends outward of an outer edge (Y1) of a corresponding first outermost electrode (1b) with respect to the first and second arrays.

A fifth aspect of this invention is based on the first aspect thereof, and provides an electronic-component mounting structure wherein the second electrodes (3) have greater areas of bond to the solder bumps (9) than areas of bond between the first electrodes (1) and the solder bumps (9).

A sixth aspect of this invention is based on the first aspect thereof, and provides an electronic-component mounting structure wherein the second outermost electrodes (3b, 3c) include electrodes (3c) having elliptical shapes whose major axes are perpendicular to a related side of a polygon formed by the second array.

A seventh aspect of this invention is based on the first aspect thereof, and provides an electronic-component mounting structure wherein the second outermost electrodes (3b, 3c) include comer electrodes (3b) located in corners of the second array respectively, and a center of each of the comer electrodes (3b) extends radially outward of a center of a corresponding first outermost electrode (1b) with respect to centers of the first and second arrays.

An eighth aspect of this invention is based on the seventh aspect thereof, and provides an electronic-component mounting structure wherein each of the corner electrodes (3b) has a circular shape greater in area than a corresponding first outermost electrode (1b).

A ninth aspect of this invention is based on the seventh aspect thereof, and provides an electronic-component mounting structure wherein each of the comer electrodes (3b) has an elliptical shape whose major axis is parallel to a radial direction from the centers of the first and second arrays.

A tenth aspect of this invention is based on the first aspect thereof, and provides an electronic-component mounting structure wherein the second outermost electrodes (3b, 3c) include electrodes (3b, 3c) having elliptical shapes whose major axes are parallel to respective radial directions from centers of the first and second arrays.

An eleventh aspect of this invention is based on the first aspect thereof, and provides an electronic-component mounting structure wherein an inner edge (X2, Z2) of each of the second outermost electrodes (3b, 3c) extends outward of an inner edge (Y2) of a corresponding first outermost electrode (1b) with respect to the first and second arrays.

A twelfth aspect of this invention is based on the first aspect thereof, and provides an electronic-component mounting structure wherein the second electrodes (3) include inner electrodes (3a) extending inward of the second outermost electrodes (3b, 3c) with respect to the second array, and the inner electrodes (3a) are substantially equal in size to corresponding first electrodes (1).

A thirteenth aspect of this invention is based on the first aspect thereof, and provides an electronic-component mounting structure wherein the second electrodes (3) include inner electrodes (3a) extending inward of the second outermost electrodes (3b, 3c) with respect to the second array, and the inner electrodes (3a) are greater in area than corresponding first electrodes (1), and wherein an outer edge of each of the inner electrodes (3a) extends outward of an outer edge of a corresponding first electrode (1) with respect to the first and second arrays.

A fourteenth aspect of this invention is based on the thirteenth aspect thereof, and provides an electronic-component mounting structure wherein the inner electrodes (3a) have elliptical shapes.

A fifteenth aspect of this invention is based on the fourteenth aspect thereof, and provides an electronic-component mounting structure wherein major axes of the elliptical shape of each of the inner electrodes (3a) are parallel to respective radial directions from centers of the first and second arrays.

A sixteenth aspect of this invention is based on the fourteenth aspect thereof, and provides an electronic-component mounting structure wherein a major axis of the elliptical shape of each of the inner electrodes (3a) increases as the inner electrode is remoter from centers of the first and second arrays.

A seventeenth aspect of this invention provides an electronic-component mounting structure comprising an electronic component (2) having a surface; first electrodes (1) provided on the surface of the electronic component (2) and arranged in a first array; a base board (4); second electrodes (3) provided on the base board (4) and arranged in a second array corresponding to the first array, the second electrodes (3) corresponding to the first electrodes (1) respectively; and solder bumps (9) connecting the first electrodes (1) and the second electrodes (3) respectively; wherein ones of the first electrodes (1) and the second electrodes have a greater strength of bond to the solder bumps (9) than a strength of bond between others and the solder bumps (9); wherein the first electrodes (1) include first outermost electrodes (1b) located in an outer area of the first array, and the second electrodes (3) include second outermost electrodes (3b, 3c) located in an outer area of the second array, the second outermost electrodes (3b, 3c) corresponding to the first outermost electrodes (1b) respectively; and wherein an outer edge of each of ones of the first outermost electrodes (1b) and the second outermost electrodes (3b, 3c) extends outward of an outer edge (Y1) of a corresponding one of the first outermost electrodes (1b) and the second outermost electrodes (3b, 3c) with respect to the first and second arrays.

An eighteenth aspect of this invention is based on the first aspect thereof, and provides an electronic-component mounting structure which is used in a portable electronic apparatus.

DESCRIPTION OF THE PREFERRED EMBODIMENTS

In the following description of embodiments and claims of this invention, elliptical shapes mean ellipses, and also ellipse-like shapes having opposite semicircular ends and two parallel straight sides connecting the ends.

First Embodiment

Figure 1:
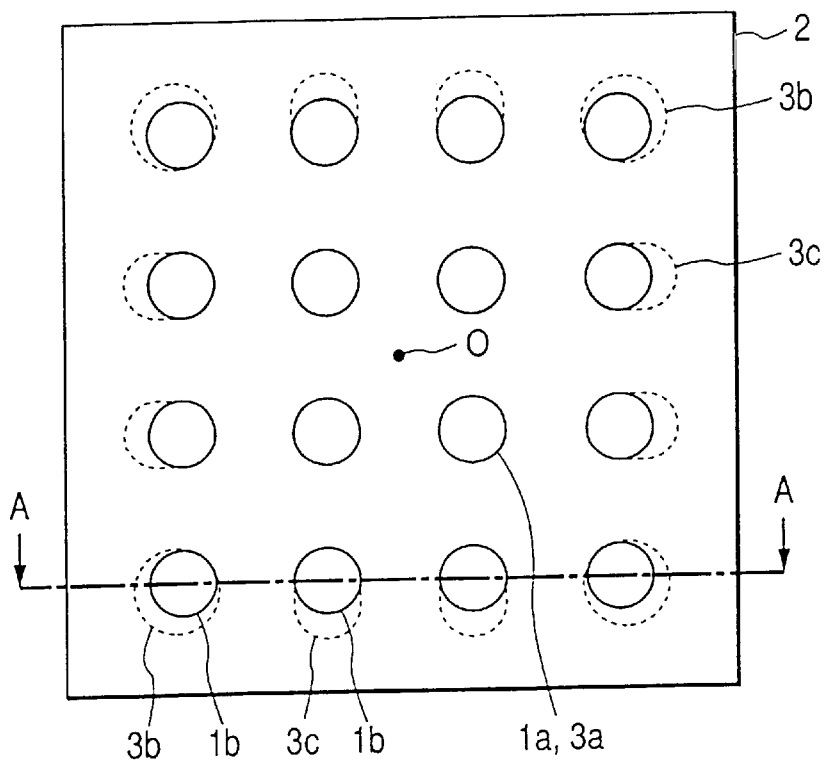
FIG. 1 is a plan view of electrodes on a BGA package and electrodes on a multiple-layer printed circuit board in an electronic-component mounting structure according to a first embodiment of this invention.
Figure 2:
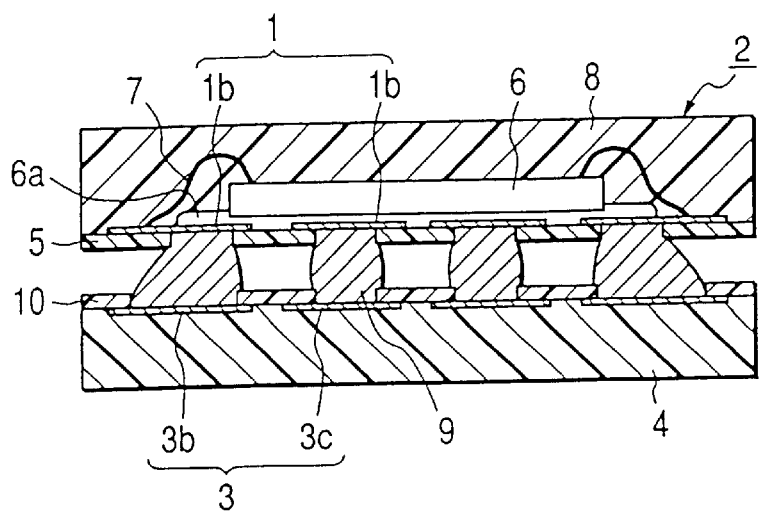
FIG. 2 is a sectional view taken along the line A—A in FIG. 1.

With reference to FIGS. 1 and 2, an array of electrodes 1 are provided on a lower surface or a lower side of a BGA package (a ball grid array package) 2. An array of electrodes 3 are provided on an upper surface or an upper side of a multiple-layer printed circuit board 4. The BGA package 2 is mounted on the multiple-layer printed circuit board 4.

The electrodes 1 on the BGA package 2 include electrodes 1a and 1b which are in a predetermined pattern (a predetermined array) denoted by the solid lines. The electrodes 3 on the printed circuit board 4 include electrodes 3a, 3b, and 3c which are in a predetermined pattern (a predetermined array) denoted by the broken lines.

The BGA package 2 is fabricated as follows. An interposer 5 is prepared. The interposer 5 has the electrodes 1 and also circuit wiring lines. The electrodes 1 are electrically connected to the circuit wiring lines. Alternatively, the circuit wiring lines may contain the electrodes 1. A semiconductor chip 6 is placed on the interposer 5. A layer of adhesive 6a extends between the interposer 5 and the semiconductor chip 6. Thus, the semiconductor chip 6 is mounted on the interposer 5 by the adhesive 6a. The circuit wiring lines and the semiconductor chip 6 are electrically connected by Au (gold) wires 7. Subsequently, resin 8 for encapsulation is provided to cover and encapsulate the semiconductor chip 6 and the Au wires 7.

The interposer 5 is made of, for example, polyimide. The interposer 5 may be made of other material which enables the interposer 5 to be of a thin structure and a high productivity. The encapsulation resin 8 uses, for example, epoxy resin. The interposer 5 defines a back surface or a back side of the BGA package 2, that is, the lower surface or the lower side of the BGA package 2 in FIG. 2. The interposer 5 has an array of circular apertures for enabling molten solder balls to meet the electrodes 1. The solder balls bond to the electrodes 1 as they cool. The solder balls form solder bumps 9 which extend through the circular apertures in the interposer 5 respectively. In this way, an array of solder bumps 9 are provided on the back surface or the back side of the BGA package 2.

Before the solder bumps 9 are provided, the electrodes 1 are exposed at the circular apertures of the interposer 5. The exposed electrodes 1 have circular shapes. The exposed electrodes 1 are in a matrix array having predetermined pitches along a vertical direction and a horizontal direction as viewed in FIG. 1 respectively. The electrodes 1 include, for example, Cu (copper) platings or electrolytic NI—Au (nickel-gold) platings which provide a high strength of the bond to the solder bumps 9.

The interposer 5 has pads which are electrically connected to the circuit wiring lines. The electrodes 1 mean portions of the pads to which the solder bumps 9 should bond, that is, portions of the pads which are exposed at the circular apertures of the interposer 5. The electrodes 1 include inner electrodes 1a located in an inner area of the array, and outermost electrodes 1b located in an outer area of the array.

The multiple-layer printed circuit board 4 includes a laminate of plural wiring line layers. The electrodes 3 are electrically connected to the wiring line layers. The electrodes 3 are provided on the upper surface of the multiple-layer printed circuit board 4. The electrodes 3 are formed by electroless Ni-Au (nickel-gold) platings which provide a lower strength of the bond to the solder bumps 9 than that provided by the electrodes 1. A solder resist layer 10 for protecting wiring lines is provided on the upper surface of the multiple-layer printed circuit board 4. The solder resist layer 10 has a plurality of openings at which the electrodes 3 are exposed.

The multiple-layer printed circuit board 4 has pads electrically connected to the wiring line layers. The electrodes 3 mean portions of the pads to which the solder bumps 9 should bond, that is, portions of the pads which are exposed at the openings of the solder resist layer 10.

As shown in FIG. 1, the electrodes 3 on the multiple-layer printed circuit board 4 are in a matrix array corresponding to the matrix array of the electrodes 1 on the BGA package 2. Thus, the electrodes 3 on the multiple-layer printed circuit board 4 positionally correspond to the electrodes 1 on the BGA package 2 respectively. A reflowing process is implemented so that the electrodes 3 on the multiple-layer printed circuit board 4 are connected to the corresponding electrodes 1 on the BGA package 2 by the solder bumps 9. Thus, the electrodes 3 on the multiple-layer printed circuit board 4 and the corresponding electrodes 1 on the BGA package 2 are connected by solder joints including the solder bumps 9.

The electrodes 3 on the multiple-layer printed circuit board 4 include inner electrodes 3a located in an inner area of the array, and outermost electrodes 3b and 3c located in an outer area of the array. The inner electrodes 3a have circular shapes equal in size to the circular shapes of the corresponding electrodes 1 on the BGA package 2. Among the outer electrodes on the multiple-layer printed circuit board 4, four electrodes 3b are at the four corners of the array respectively. These electrodes 3b are referred to as the corner electrodes. The other outermost electrodes 3c are not at the corners of the array. These electrodes 3c are referred to as the non-corner outermost electrodes. The corner electrodes 3b have circular shapes greater in diameter than the circular shapes of the corresponding electrodes 1 on the BGA package 2. The non-corner outermost electrodes 3c have elliptical shapes whose major axes are longer than the diameters of the corresponding electrodes 1 on the BGA package 2, and whose minor axes are equal in length to the diameters of the corresponding electrodes 1 on the BGA package 2.

The corner electrodes 3b on the multiple-layer printed circuit board 4 are similar in design to each other. One of the comer electrodes 3b will be explained below in detail.

Figure 3:
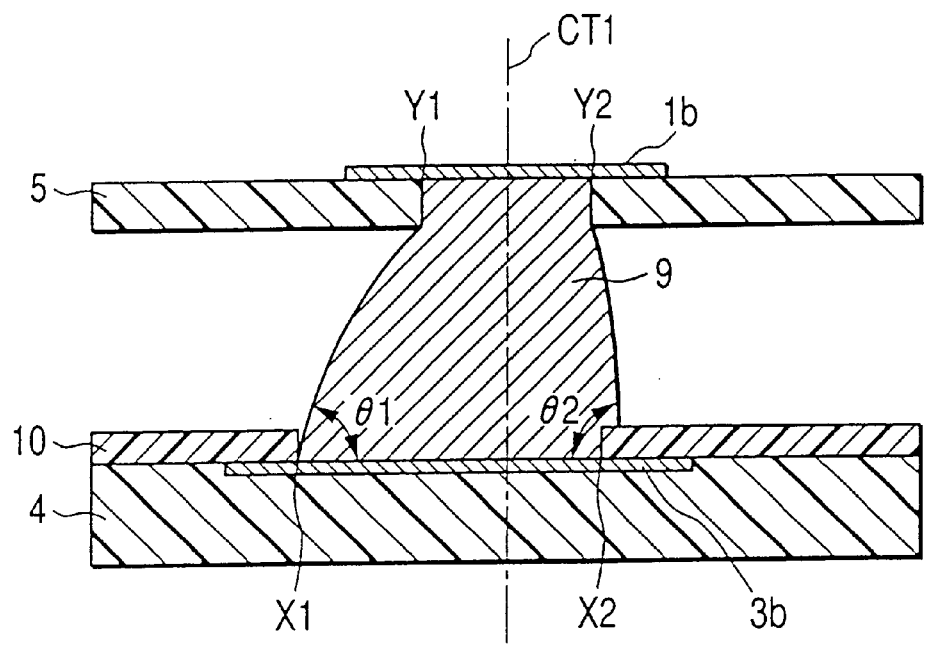
FIG. 3 is a sectional view of a comer electrode on the multiple-layer printed circuit board, a corresponding outermost electrode on the BGA package, and a corresponding solder bump in the electronic-component mounting structure of FIG. 1.
Figure 4:
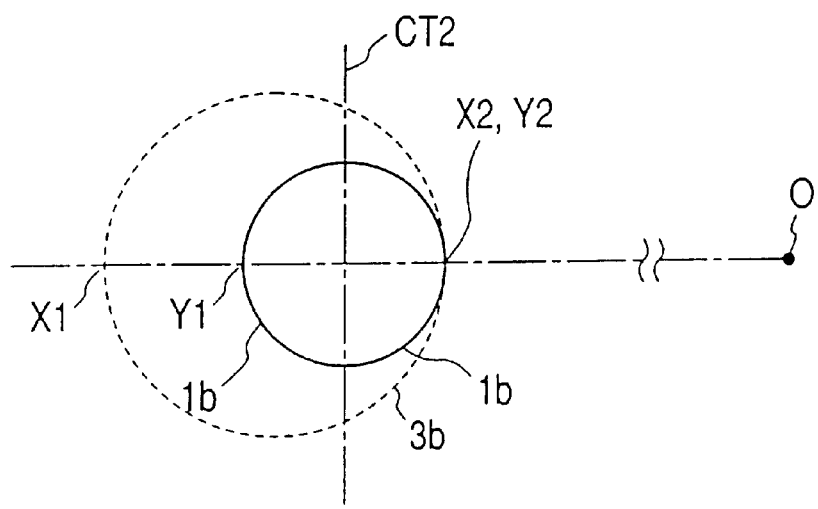
FIG. 4 is a plan view of the corner electrode on the multiple-layer printed circuit board, and the corresponding outermost electrode on the BGA package in FIG. 3.

In FIG. 3, the line CT1 denotes the central axis of the outermost electrode 1b on the BGA package 2 which corresponds to one of the corner electrodes 3b on the multiple-layer printed circuit board 4. In FIG. 4, the line CT2 denotes a line passing through the center of the outermost electrode 1b. As shown in FIG. 3, the center of the corner electrode 3b is offset from the center of the corresponding outermost electrode 1b. Specifically, as shown in FIGS. 1 and 4, the offset is designed so that the center of the comer electrode 3b is remoter from the center "O" of the BGA package 2 than the center of the corresponding outermost electrode 1b is. Thus, as shown in FIG. 4, an edge X1 of the comer electrode 3b which is remoter from the center "O" of the BGA package 2 extends outward of a corresponding edge Y1 of the outermost electrode 1b with respect to the electrode arrays. The edge X1 of the corner electrode 3b which is remoter from the center "O" of the BGA package 2 defines a part of the edge of the array of the electrodes 3 on the multiple-layer printed circuit board 4.

With reference to FIG. 3, the solder bump 9 which occurs after the reflowing process has a shape as follows. The interface between the solder bump 9 and the outermost electrode 1b is parallel to the interface between the solder bump 9 and the corner electrode 3b.

In FIG. 3, a section of the solder bump 9 is approximately trapezoid, 5 having upper and lower sides which are parallel to each other, and which adjoin the outermost electrode 1b and the corner electrode 3b respectively. A side of the section of the solder bump 9 which is remoter from the center "O" of the BGA package 2 is longer than its side closer to the center "O". As shown in FIG. 3, at the edge X1 of the comer electrode 3b, the angle θ1 between the upper surface of the corner electrode 3b and a surface of the solder bump 9 is acute (that is, smaller than an angle of 90 degrees). At an edge X2 of the corner electrode 3b which is the closest to the center "O" of the BGA package 2, there is an angle θ2 between the upper surface of the corner electrode 3b and a surface of the solder bump 9 which is greater than the angle θ1. Accordingly, a portion of the solder bump 9 is thicker as the portion moves away from the outermost electrode 1b toward the comer electrode 3b (see FIG. 3). Thus, the portion of the solder bump 9 adjacent to the outermost electrode 1b is the thinnest while the portion of the solder bump 9 adjacent to the corner electrode 3b is the thickest.

As previously mentioned, the offset between the electrodes 1b and 3b is designed so that the center of the comer electrode 3b is remoter from the center "O" of the BGA package 2 than the center of the corresponding outermost electrode 1b is. This directivity of the offset prevents the distances between the corner electrode 3b and neighboring electrodes 3 from being shortened (see FIG. 1).

As shown in FIGS. 3 and 4, the edge X2 of the corner electrode 3*b* which is the closest to the center "O" of the BGA package 2 vertically aligns with a corresponding edge Y2 of the electrode 1*b*. As best shown in FIG. 4, the amount of the offset between the electrodes 1*b* and 3*b* corresponds to the difference between the radii of the electrodes 1*b* and 3*b*.

The non-corner outermost electrodes 3*c* on the multiple-layer printed circuit board 4 are similar in design to each other. One of the non-corner outermost electrodes 3*c* will be explained below in detail.

With reference to FIG. 1, the non-corner outermost electrode 3*c* has an elliptical shape. The minor axis of the elliptical shape of the non-corner outermost electrode 3*c* is parallel to the side of the quadrilateral of the array of the electrodes 3 which has the electrode 3*c* in question. The major axis of the elliptical shape of the non-corner outermost electrode 3*c* is perpendicular to the side of the quadrilateral of the array of the electrodes 3 which has the electrode 3*c* in question.

Figure 5:
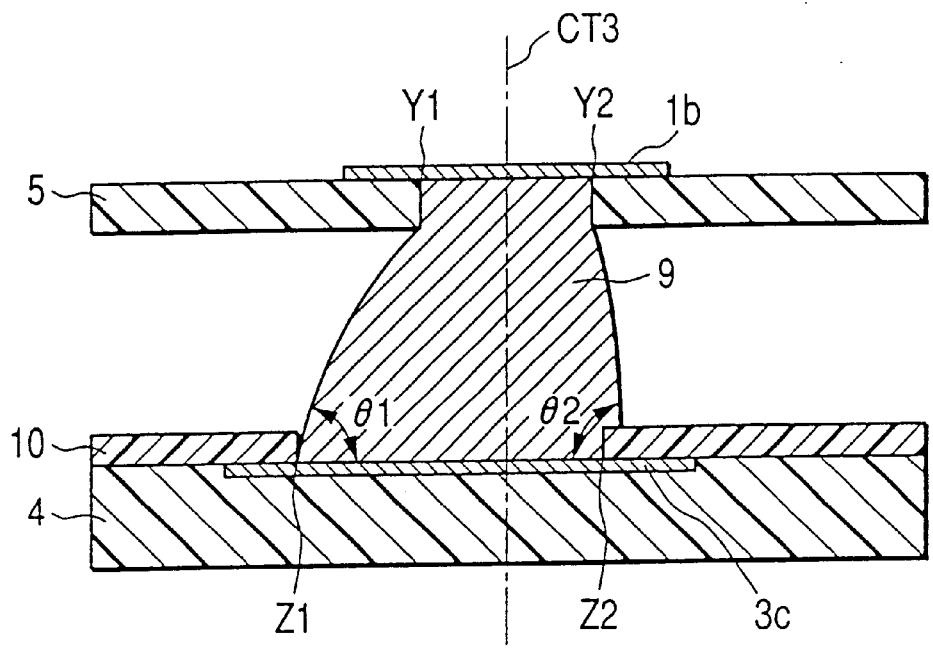
FIG. 5 is a sectional view of a non-corner outermost electrode on the multiple-layer printed circuit board, a corresponding outermost electrode on the BGA package, and a corresponding solder bump in the electronic-component mounting structure of FIG. 1.
Figure 6:
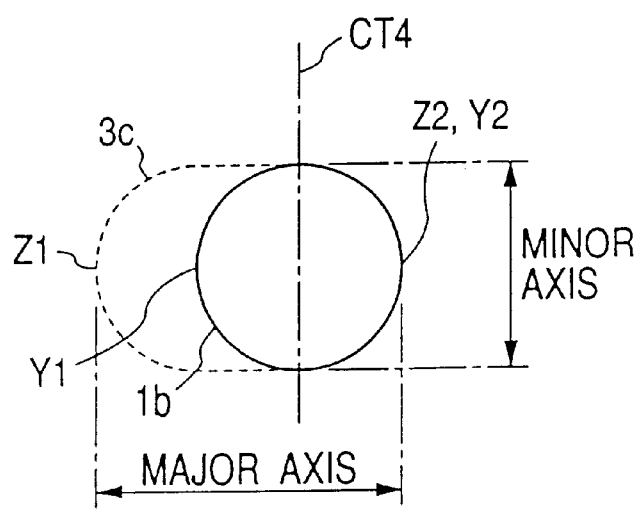
FIG. 6 is a plan view of the non-corner outermost electrode on the multiple-layer printed circuit board, and the corresponding outermost electrode on the BGA package in FIG. 5.

In FIG. 5, the line CT3 denotes the central axis of the outermost electrode 1*b* on the BGA package 2 which corresponds to one of the non-corner outermost electrodes 3*c* on the multiple-layer printed circuit board 4. In FIG. 6, the line CT4 denotes a line passing through the center of the outermost electrode 1*b*. As shown in FIGS. 5 and 6, an inner edge Z2 of the non-corner outermost electrode 3*c* with respect to the array of the electrodes 3 vertically aligns with a corresponding edge Y2 of the related outermost electrode 1*b*. On the other hand, an outer edge Z1 of the non-corner outermost electrode 3*c* extends outward of a corresponding edge Y1 of the related outermost electrode 1*b* with respect to the electrode arrays.

With reference to FIG. 5, the solder bump 9 which occurs after the reflowing process has a shape as follows. The interface between the solder bump 9 and the outermost electrode 1*b* is parallel to the interface between the solder bump 9 and the non-corner outermost electrode 3*c*. In FIG. 5, a section of the solder bump 9 is approximately trapezoid, having upper and lower sides which are parallel to each other, and which adjoin the outermost electrode 1*b* and the non-corner outermost electrode 3*c* respectively. An outer side of the section of the solder bump 9 with respect to the electrode arrays is longer than an inner side thereof. As shown in FIG. 5, at the outer edge Z1 of the non-corner outermost electrode 3*c*, the angle θ1 between the upper surface of the non-corner outermost electrode 3*c* and a surface of the solder bump 9 is acute (that is, smaller than an angle of 90 degrees). At the inner edge Z2 of the non-corner outermost electrode 3*c*, there is an angle θ2 between the upper surface of the non-corner outermost electrode 3*c* and a surface of the solder bump 9 which is greater than the angle θ1. Accordingly, a portion of the solder bump 9 is thicker as the portion moves away from the outermost electrode 1*b* toward the non-corner outermost electrode 3*c* (see FIG. 5). Thus, the portion of the solder bump 9 adjacent to the outermost electrode 1*b* is the thinnest while the portion of the solder bump 9 adjacent to the non-corner outermost electrode 3*c* is the thickest.

As previously mentioned, the outer edge X1 of each corner electrode 3*b* extends outward of the outer edge Y1 of the corresponding outermost electrode 1*b* with respect to the quadrilaterals of the electrode arrays. Similarly, the outer edge Z1 of each non-corner outermost electrode 3*c* extends outward of the outer edge Y1 of the corresponding outermost electrode 1*b* with respect to the quadrilaterals of the electrode arrays.

Figure 7:
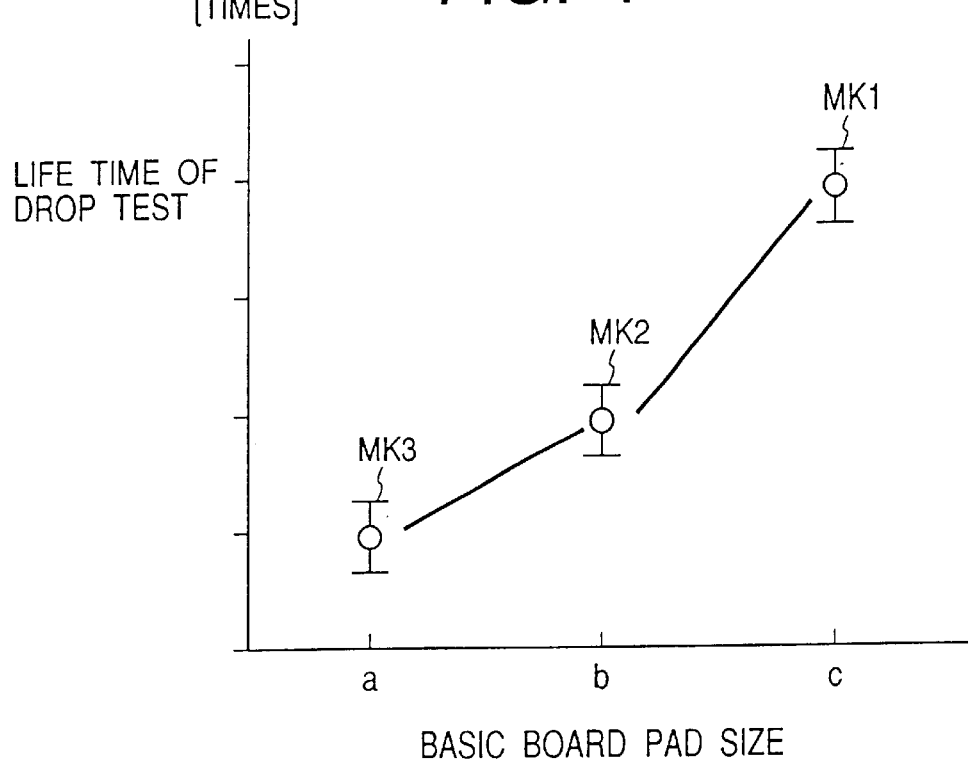
FIG. 7 is a diagram of the relation between the life time of drop test and a base-board pad size.

A sample of an electronic-component mounting structure of this embodiment was made. In addition, samples of comparative electronic-component mounting structures were made. The samples were brought to drop tests, and the life time of solder bumps in each of the samples was measured. The results of the measurement are shown in FIG. 7 where the mark MK1 denotes the result of the measurement on the sample of the structure of this embodiment while the marks MK2 and MK3 denote the results of the measurement on the samples of the comparative structures. The mark MK1 is at a base-board pad size "c". The marks MK2 and MK3 are at base-board pad sizes "b" and "a" respectively.

The sample of the comparative structure which corresponds to the mark MK3 in FIG. 7 was designed so that corner electrodes and non-corner outermost electrodes on a multiple-layer printed circuit board were equal in size to electrodes on a BGA package. The sample of the comparative structure which corresponds to the mark MK2 in FIG. 7 was designed so that corner electrodes and non-corner outermost electrodes on a multiple-layer printed circuit board had circular shapes slightly greater in diameter than circular shapes of electrodes on a BGA package, and that outer edges of the corner electrodes and the non-corner outermost electrodes on the multiple-layer printed circuit board extended outward of outer edges of the electrodes on the BGA package with respect to quadrilaterals of electrode arrays.

The life time of solder bumps in the sample of the comparative structure corresponding to the mark MK2 in FIG. 7 is longer than that of solder bumps in the sample of the comparative structure corresponding to the mark MK3 in FIG. 7. The life time of solder bumps in the sample of the structure of this embodiment which corresponds to the mark MK1 in FIG. 7 is longer than that of solder bumps in the sample of the comparative structure corresponding to the mark MK2 in FIG. 7. Thus, a long life time of the solder bumps 9 in this embodiment is found to be caused by the arrangement that the outer edge X1 or Z1 of each corner electrode 3*b* or each non-corner outermost electrode 3*c* extends outward of the outer edge Y1 of the corresponding outermost electrode 1*b* with respect to the quadrilaterals of the electrode arrays. The reason for the long life time of the solder bumps 9 is as follows.

At the outer edge X1 or Z1 of each corner electrode 3*b* or each non-corner outermost electrode 3*c*, the angle θ1 between the upper surface of the corner electrode 3*b* or the non-corner outermost electrode 3*c* and a surface of the solder bump 9 is acute (that is, smaller than an angle of 90 degrees). The acute angle θ1 makes it possible to relieve stresses which occur at the interfaces among the corner electrodes 3*b*, the non-corner outermost electrodes 3*c*, and the solder bumps 9 upon the application of a mechanical shock to the electronic-component mounting structure. The portion of each corner electrode 3*b* which extends outward of the corresponding outermost electrode 1*b* (which does not overlap the corresponding outermost electrode 1*b*) enables the corner electrode 3*b* to withstand stresses in many different directions.

As previously mentioned, the electrodes 1 on the BGA package 2 have a high strength of the bond to the solder bumps 9. Accordingly, the solder bumps 9 hardly separate from the electrodes 1. All portions of each solder bump 9 are equal to or greater than the related electrode 1 in diameter. Thus, the life time of the solder bumps 9 can be longer than that of prior-art solder bumps which have constricted middle portions as in Japanese published unexamined patent application 9-45733. The electronic-component mounting structure of this embodiment provides a long life time of the solder bumps 9 even in the case where mechanical shocks are applied thereto.

Upon the application of a mechanical shock to the electronic-component mounting structure of this embodiment, the resulting stresses applied to the solder joints among the outermost electrodes 3b and 3c on the multiple-layer printed circuit board 4 and the corresponding outermost electrodes 1b on the BGA package 2 are greater than those applied to the solder joints among the inner electrodes 3a on the multiple-layer printed circuit board 4 and the corresponding inner electrodes la on the BGA package 2. Thus, the mechanical strength of the solder joints among the inner electrodes 3a on the multiple-layer printed circuit board 4 and the corresponding inner electrodes la on the BGA package 2 is less important than that of the solder joints among the outermost electrodes 3b and 3c on the multiple-layer printed circuit board 4 and the corresponding outermost electrodes 1b on the BGA package 2. Accordingly, the long life time of the solder joints among the outermost electrodes 3b and 3c on the multiple-layer printed circuit board 4 and the corresponding outermost electrodes 1b on the BGA package 2 causes a long life time of the electronic-component mounting structure.

As previously mentioned, the inner electrodes 3a on the multiple-layer printed circuit board 4 are equal in size to the inner electrodes la on the BGA package 2. According to this designing, the distances among neighboring inner electrodes 3a on the multiple-layer printed circuit board 4 can be relatively great, and hence wide spaces can be used for electric wiring lines connected to the inner electrodes 3a. Thus, it is possible to attain a high degree of freedom of designing electric wiring lines on the multiple-layer printed circuit board 4.

As previously indicated, the angle θ2 between the upper surface of each outermost electrode 3b or 3c and the surface of the solder bump 9 at the electrode inner edge X2 or Z2 is greater than the corresponding angle θ1 at the electrode outer edge X1 or Z1. Therefore, the distances between the outer electrodes 3b and 3c and the inner electrodes 3a can be prevented from being shortened. Also in this regard, it is possible to attain a high degree of freedom of designing electric wiring lines on the multiple-layer printed circuit board 4.

As previously mentioned, the electrodes 1 on the BGA package 2 provide a higher strength of the bond to the solder bumps 9 than the electrodes 3 on the multiple-layer printed circuit board 4 do. The reason therefor is as follows. The electrodes 1 are formed by an electrolytic plating process while the electrodes 3 are formed by an electroless plating process. The electrolytic plating process uses a predetermined applied voltage. On the other hand, the application of a voltage is absent from the electroless plating process. The electrolytic plating process requires leads for feeding the predetermined voltage. Regarding the BGA package 2, it is possible to provide a space for the voltage-feeding leads. On the other hand, regarding the multiple-layer printed circuit board 4, it tends to be difficult to provide a space for such voltage-feeding leads. Therefore, the electrodes 3 on the multiple-layer printed circuit board 4 are formed by the electroless plating process. Since the electrodes 3 on the multiple-layer printed circuit board 4 are given a long life time as previously mentioned, it is possible to compensate for the lower strength of the bond between the electrodes 3 and the solder bumps 9.

Second Embodiment

A second embodiment of this invention is similar to the first embodiment thereof except for shapes of outermost electrodes 3b and 3c on a multiple-layer printed circuit board 4.

Figure 8:
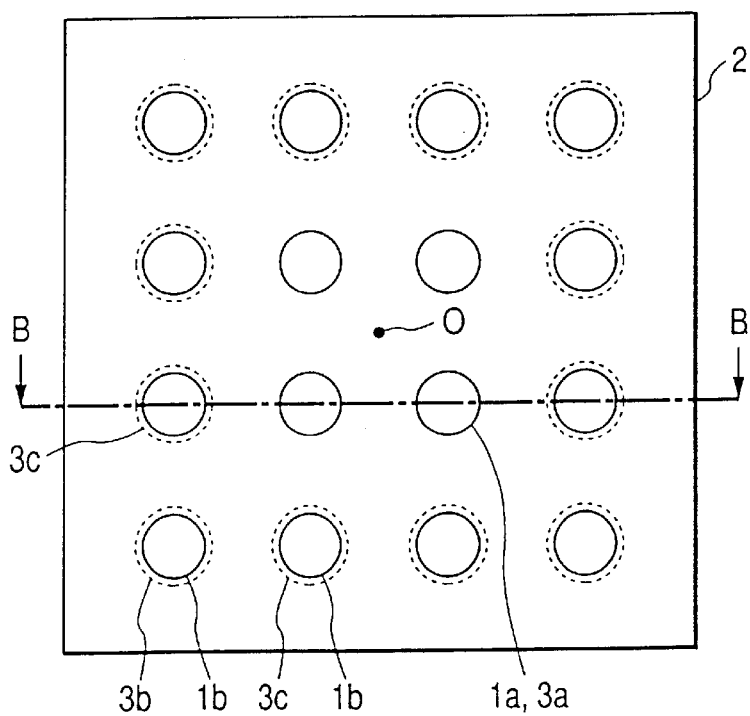
FIG. 8 is a plan view of electrodes on a BGA package and electrodes on a multiple-layer printed circuit board in an electronic-component mounting structure according to a second embodiment of this invention.
Figure 9:
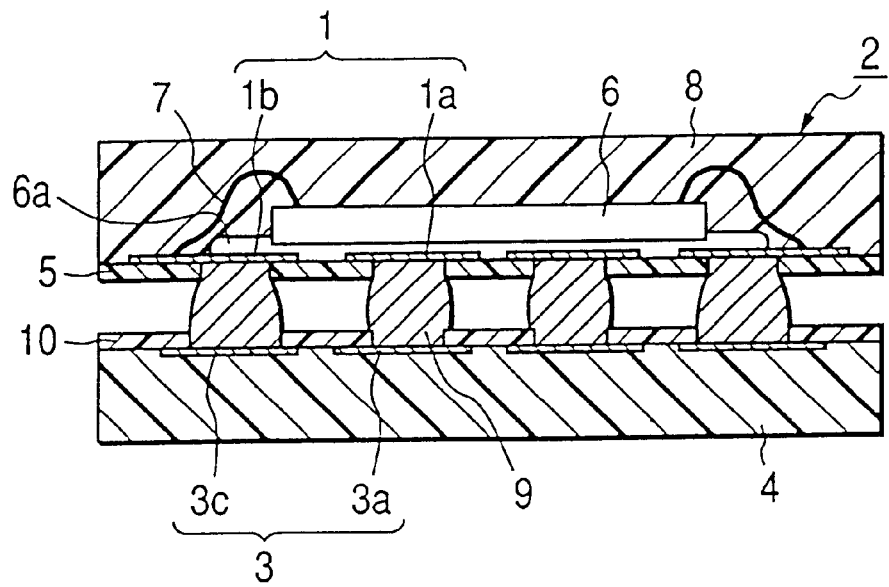
FIG. 9 is a sectional view taken along the line B—B in FIG. 8.

In the second embodiment of this invention, as shown in FIGS. 8 and 9, outermost electrodes 3b and 3c on a multiple-layer circuit board 4 have circular shapes greater in diameter than circular shapes of corresponding outermost electrodes 1b on a BGA package 2. The outermost electrodes 3b and 3c coaxially align with the corresponding outermost electrodes 1b respectively.

All electrodes 3 on the multiple-layer circuit board 4 which include the outermost electrodes 3b and 3c are arranged and spaced at predetermined pitches along a vertical direction and a horizontal direction as viewed in FIG. 8. The outermost electrodes 1b on the BGA package 2 are contained in the corresponding outermost electrodes 3b and 3c on the multiple-layer circuit board 4 as viewed from above (see FIG. 8). An outer edge of each outermost electrode 3b or 3c extends outward of an outer edge of the corresponding outermost electrode 1b with respect to quadrilaterals of electrode arrays.

Solder bumps 9 are similar to each other. One of the solder bumps 9 will be explained in detail below.

Figure 10:
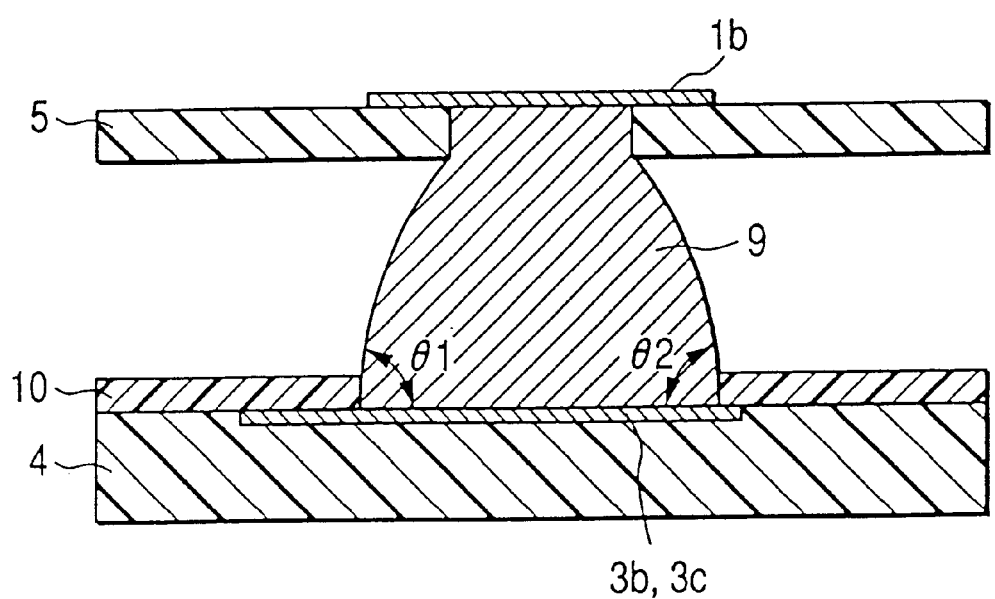
FIG. 10 is a sectional view of an outermost electrode on the multiple-layer printed circuit board, a corresponding outermost electrode on the BGA package, and a corresponding solder bump in the electronic-component mounting structure of FIG. 8.

With reference to FIG. 10, a solder bump 9 which occurs after a reflowing process has a shape as follows. The interface between the solder bump 9 and the outermost electrode 1b is parallel to the interface between the solder bump 9 and the outermost electrode 3b or 3c. As shown in FIG. 10, at an outer edge of the outermost electrode 3b or 3c with respect to the electrode array, the angle θ1 between the upper surface of the outermost electrode 3b or 3c and a surface of the solder bump 9 is acute (that is, smaller than an angle of 90 degrees). At an inner edge of the outermost electrode 3b or 3c with respect to the electrode array, there is an angle θ2 between the upper surface of the outermost electrode 3b or 3c and a surface of the solder bump 9 which is substantially equal to the angle θ1.

According to this embodiment, the solder bumps 9 have a long life time.

Third Embodiment

A third embodiment of this invention is similar to the first embodiment thereof except for shapes of corner electrodes 3b on a multiple-layer printed circuit board 4.

Figure 11:
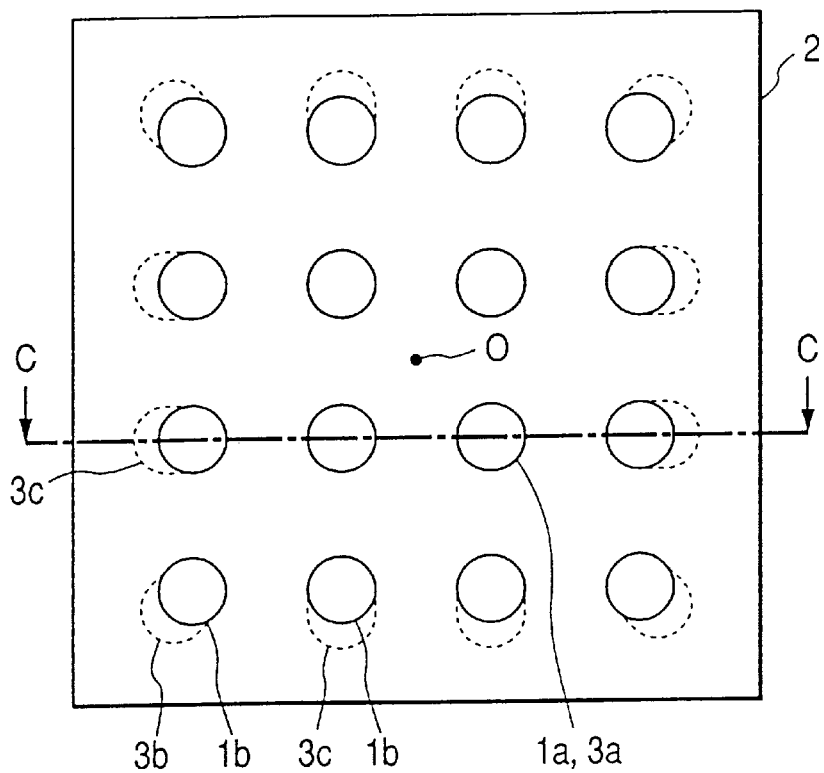
FIG. 11 is a plan view of electrodes on a BGA package and electrodes on a multiple-layer printed circuit board in an electronic-component mounting structure according to a third embodiment of this invention.
Figure 12:
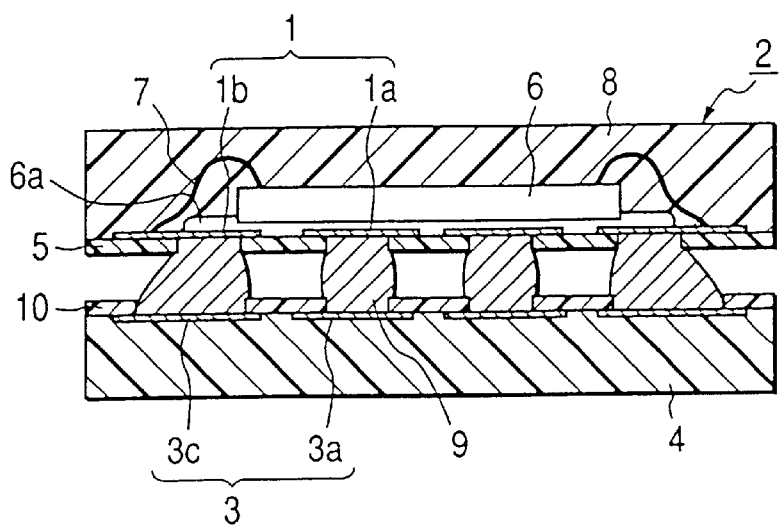
FIG. 12 is a sectional view taken along the line C—C in FIG. 11.

FIGS. 11 and 12 show the third embodiment of this invention. In this embodiment, corner electrodes 3b on a multiple-layer circuit board 4 have elliptical shapes similarly to non-corner outermost electrodes 3c. The major axis of the elliptical shape of each corner electrode 3b is parallel to a radial direction from a center "O" of a BGA package 2, that is, parallel to the line connecting the center "O" of the BGA package 2 and the center of the elliptical shape of the corner electrode 3b. An edge of each corner electrode 3b which is closer to the center "O" of the BGA package 2 vertically aligns with a corresponding edge of a related outermost electrode 1b on the BGA package 2.

An outer edge of each outermost electrode 3b or 3c extends outward of an outer edge of the corresponding outermost electrode 1b with respect to quadrilaterals of electrode arrays.

According to this embodiment, solder bumps 9 have a long life time.

Fourth Embodiment

A fourth embodiment of this invention is similar to the third embodiment thereof except for shapes of inner electrodes 3a on a multiple-layer printed circuit board 4.

Figure 13:
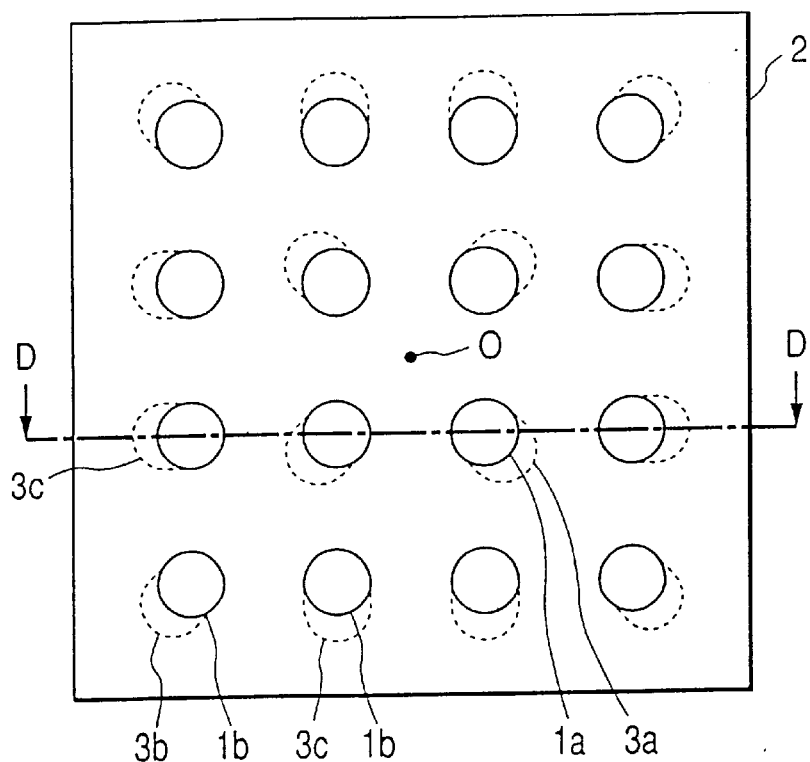
FIG. 13 is a plan view of electrodes on a BGA package and electrodes on a multiple-layer printed circuit board in an electronic-component mounting structure according to a fourth embodiment of this invention.
Figure 14:
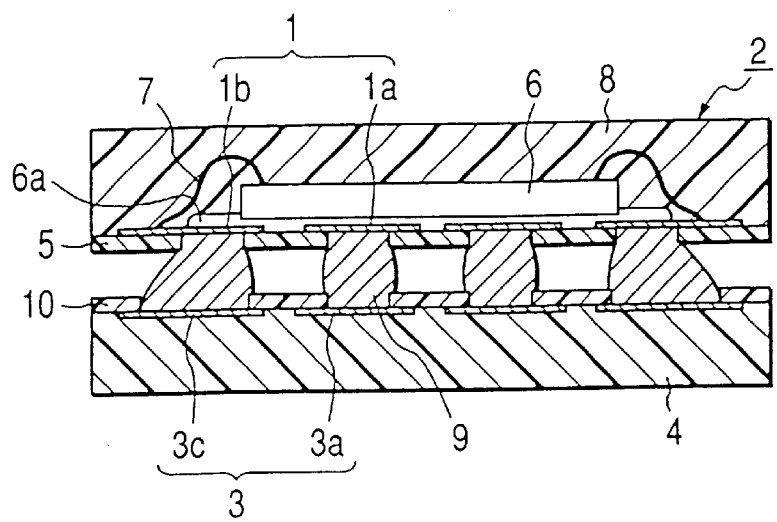
FIG. 14 is a sectional view taken along the line D—D in FIG. 13.

FIGS. 13 and 14 show the fourth embodiment of this invention.

In this embodiment, inner electrodes 3a on a multiple-layer circuit board 4 have elliptical shapes substantially equal in size to elliptical shapes of outermost electrodes 3b and 3c. The inner electrodes 3a are on the diagonal lines of a quadrilateral of a related electrode array. The major axis of the elliptical shape of each inner electrode 3a is parallel to the related diagonal line or the line connecting a center "O" of a BGA package 2 and the center of the elliptical shape of the inner electrode 3a. An edge of each inner electrode 3a which is closer to the center "O" of the BGA package 2 vertically aligns with a corresponding edge of a related inner electrode 1a on the BGA package 2.

An outer edge of each inner electrode 3a on the multiple-layer printed circuit board 4 extends outward of an outer edge of the corresponding inner electrode 1a on the BGA package 2 with respect to quadrilaterals of electrode arrays.

There may be inner electrodes 3a off the diagonal lines of the quadrilateral of the related electrode array. Preferably, such inner electrodes 3a are designed as follows. The major axis of the elliptical shape of each inner electrode 3a is perpendicular to two opposite sides of the quadrilateral of the related electrode array.

According to this embodiment, solder bumps 9 connecting the inner electrodes 3a on the multiple-layer printed circuit board 4 and the inner electrodes 1a on the BGA package 2 have a longer life time.

Fifth Embodiment

A fifth embodiment of this invention is similar to the fourth embodiment thereof except for sizes of inner electrodes 3a on a multiple-layer printed circuit board 4.

Figure 15:
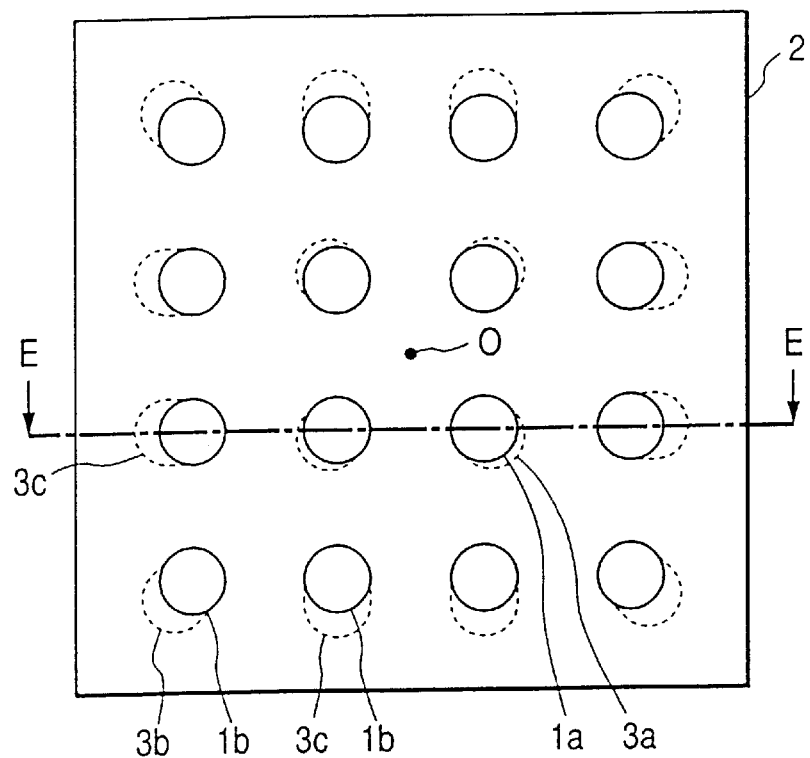
FIG. 15 is a plan view of electrodes on a BGA package and electrodes on a multiple-layer printed circuit board in an electronic-component mounting structure according to a fifth embodiment of this invention.
Figure 16:
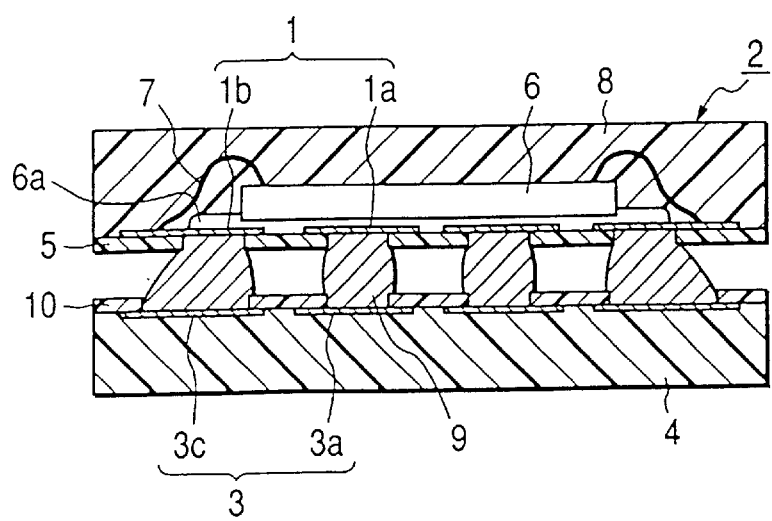
FIG. 16 is a sectional view taken along the line E—E in FIG. 15.

FIGS. 15 and 16 show the fifth embodiment of this invention. In this embodiment, inner electrodes 3a on a multiple-layer printed circuit board 4 have elliptical shapes smaller than those of elliptical shapes of outermost electrodes 3b and 3c. Specifically, the main axes of the elliptical shapes of the inner electrodes 3a are shorter than those of the elliptical shapes of the outermost electrodes 3b and 3c. The portions of the inner electrodes 3a which extend outward of corresponding inner electrodes 1a on a BGA package 2 are smaller than the portions of the outermost electrodes 3b and 3c extending outward of corresponding outermost electrodes 1b on the BGA package 2.

The major axis of the elliptical shape of each inner electrode 3a is parallel to a radial direction from the center "O" of the BGA package 2, that is, parallel to the line connecting the center "O" of the BGA package 2 and the center of the elliptical shape of the inner electrode 3a. An edge of each inner electrode 3a which is closer to the center "O" of the BGA package 2 vertically aligns with a corresponding edge of a related inner electrode 1a on the BGA package 2.

An outer edge of each inner electrode 3a on the multiple-layer printed circuit board 4 extends outward of an outer edge of the corresponding inner electrode 1a on the BGA package 2 with respect to quadrilaterals of electrode arrays.

There may be inner electrodes 3a off the diagonal lines of the quadrilateral of the related electrode array. Preferably, such inner electrodes 3a are designed as follows. The major axis of the elliptical shape of each inner electrode 3a is perpendicular to two opposite sides of the quadrilateral of the related electrode array.

According to this embodiment, solder bumps 9 connecting the inner electrodes 3a on the multiple-layer printed circuit board 4 and the inner electrodes 1a on the BGA package 2 have a longer life time.

Sixth Embodiment

A sixth embodiment of this invention is similar to the first embodiment thereof except that all electrodes 3 on a multiple-layer printed circuit board 4 have elliptical shapes of equal sizes.

Figure 17:
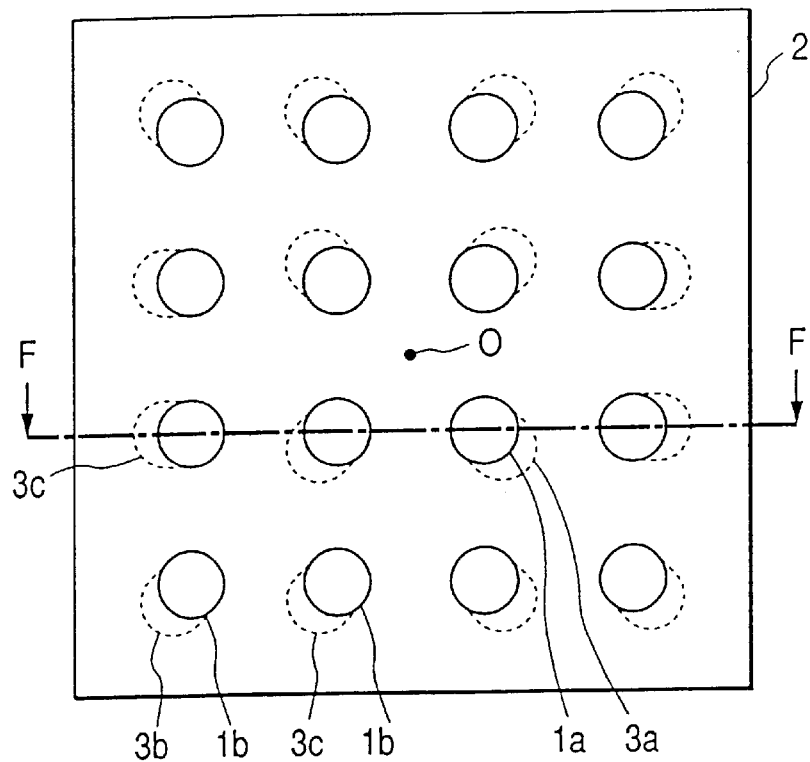
FIG. 17 is a plan view of electrodes on a BGA package and electrodes on a multiple-layer printed circuit board in an electronic-component mounting structure according to a sixth embodiment of this invention.
Figure 18:
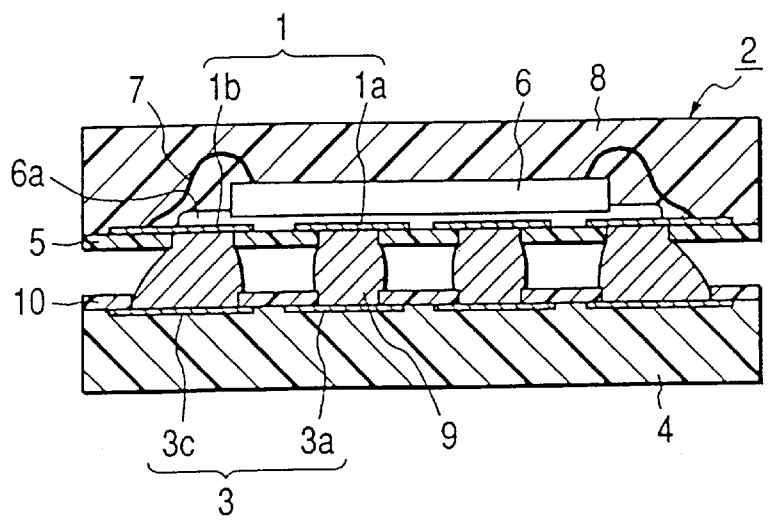
FIG. 18 is a sectional view taken along the line F—F in FIG. 17.

FIGS. 17 and 18 show the sixth embodiment of this invention. In this embodiment, the electrodes 3 on the multiple-layer printed circuit board 4 have minor axes substantially equal in length to diameters of electrodes 1 on a BGA package 2. The major axis of the elliptical shape of each electrode 3 is parallel to a radial direction from the center "O" of the BGA package 2, that is, parallel to the line connecting the center "O" of the BGA package 2 and the center of the elliptical shape of the electrode 3. An edge of each electrode 3 which is closer to the center "O" of the BGA package 2 vertically aligns with a corresponding edge of a related electrode 1 on the BGA package 2.

According to this embodiment, solder bumps 9 connecting the electrodes 3 on the multiple-layer printed circuit board 4 and the electrodes 1 on the BGA package 2 have a longer life time. In addition, the solder bumps 9 effectively withstand stresses in radial directions from the center "O" of the BGA package 2.

Seventh Embodiment

A seventh embodiment of this invention is similar to the sixth embodiment thereof except for shapes of inner electrodes 3a on a multiple-layer printed circuit board 4.

Figure 19:
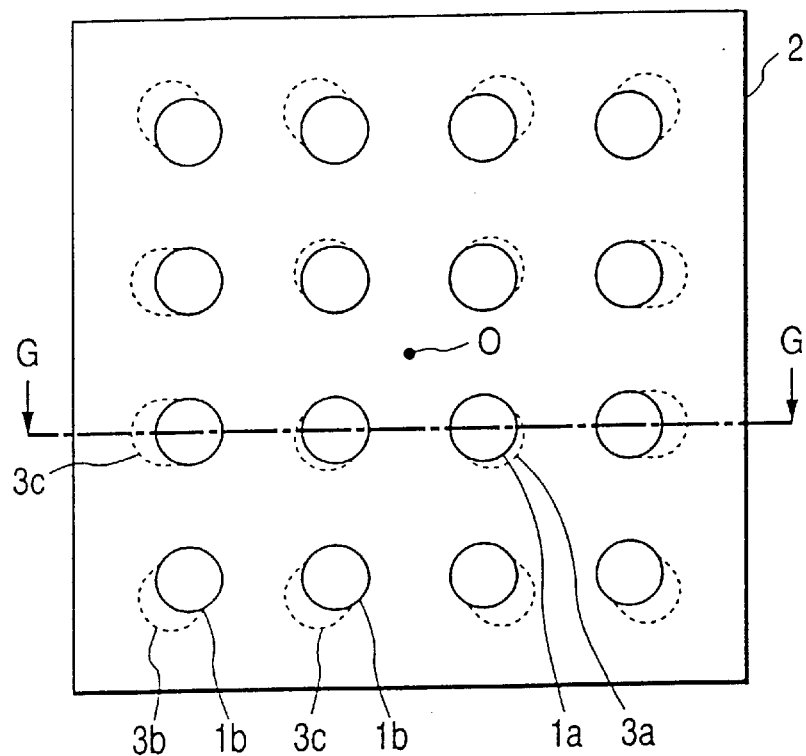
FIG. 19 is a plan view of electrodes on a BGA package and electrodes on a multiple-layer printed circuit board in an electronic-component mounting structure according to a seventh embodiment of this invention.
Figure 20:
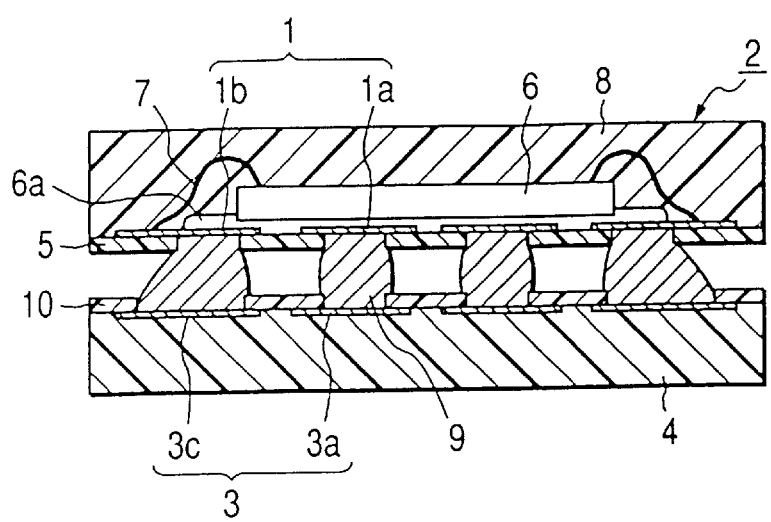
FIG. 20 is a sectional view taken along the line G—G in FIG. 19.

FIGS. 19 and 20 show the seventh embodiment of this invention. In this embodiment, inner electrodes 3a on a multiple-layer circuit board 4 have elliptical shapes whose major axes are shorter than those of elliptical shapes of outermost electrodes 3b and 3c. Thus, there is a reduction in an outer area of each inner electrode 3a on the multiple-layer printed circuit board 4 which extends outward of an outer edge of the corresponding inner electrode 1a on the BGA package 2 with respect to quadrilaterals of electrode arrays.

According to this embodiment, the distances among neighboring inner electrodes 3a on the multiple-layer printed circuit board 4 can be relatively great, and hence wide spaces can be used for electric wiring lines connected to the inner electrodes 3a. Thus, it is possible to attain a high degree of freedom of designing electric wiring lines on the multiple-layer printed circuit board 4.

It is preferable that the major axis of an electrode 3 on the multiple-layer printed circuit board 4 increases as the electrode 3 is remoter than the center of the related electrode array.

Eighth Embodiment

An eighth embodiment of this invention is similar to the sixth embodiment thereof except for shapes of inner electrodes 3a on a multiple-layer printed circuit board 4.

Figure 21:
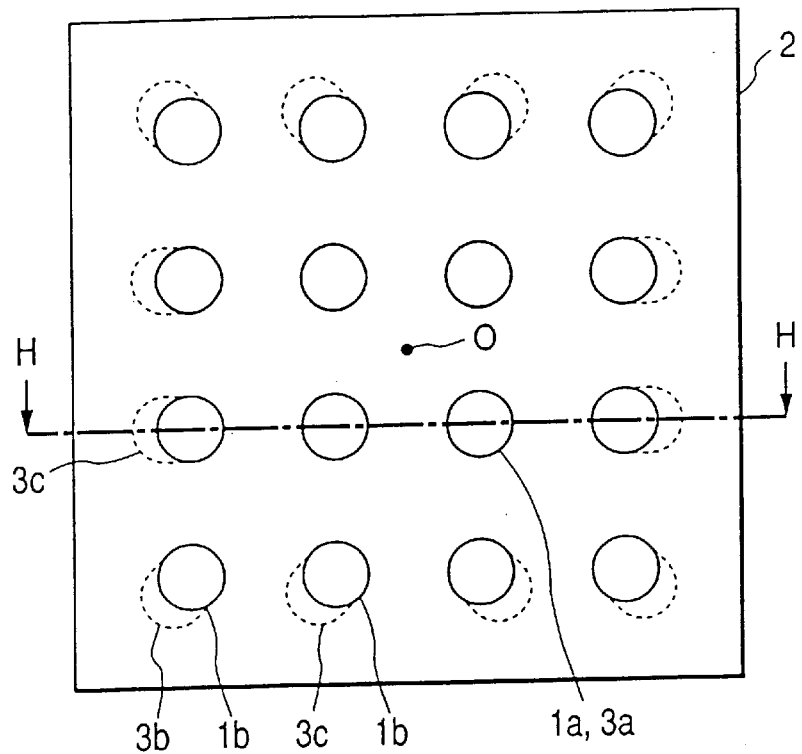
FIG. 21 is a plan view of electrodes on a BGA package and electrodes on a multiple-layer printed circuit board in an electronic-component mounting structure according to an eighth embodiment of this invention.
Figure 22:
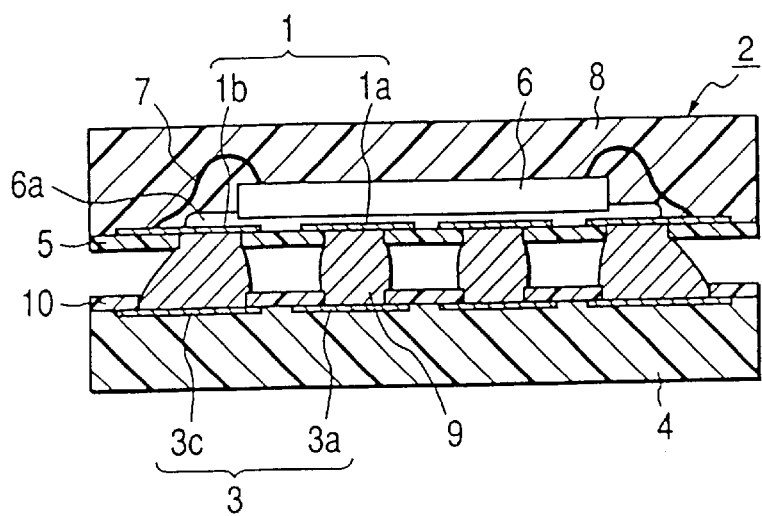
FIG. 22 is a sectional view taken along the line H—H in FIG. 21.

FIGS. 21 and 22 show the eighth embodiment of this invention. In this embodiment, inner electrodes 3a on a multiple-layer circuit board 4 have circular shapes substantially equal to circular shapes of corresponding inner electrodes 1a on a BGA package 2.

According to this embodiment, the distances among neighboring inner electrodes 3a on the multiple-layer printed circuit board 4 can be relatively great, and hence wide spaces can be used for electric wiring lines connected to the inner electrodes 3a. Thus, it is possible to attain a high degree of freedom of designing electric wiring lines on the multiple-layer printed circuit board 4.

Ninth Embodiment

A ninth embodiment of this invention is similar to the first embodiment thereof except for directions of elliptical shapes of non-corner outermost electrodes 3c on a multiple-layer printed circuit board 4.

Figure 23:
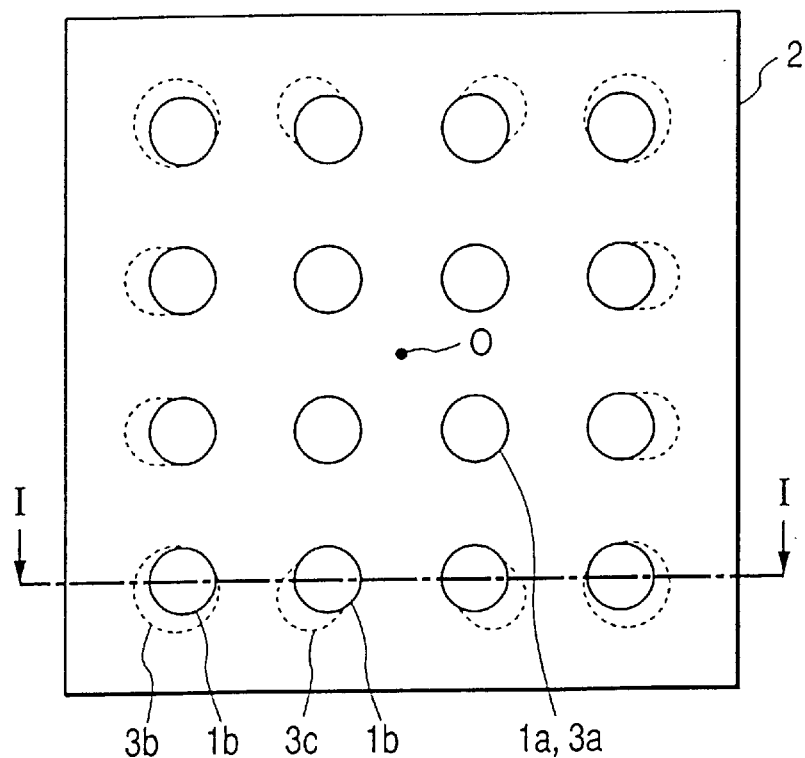
FIG. 23 is a plan view of electrodes on a BGA package and electrodes on a multiple-layer printed circuit board in an electronic-component mounting structure according to a ninth embodiment of this invention.
Figure 24:
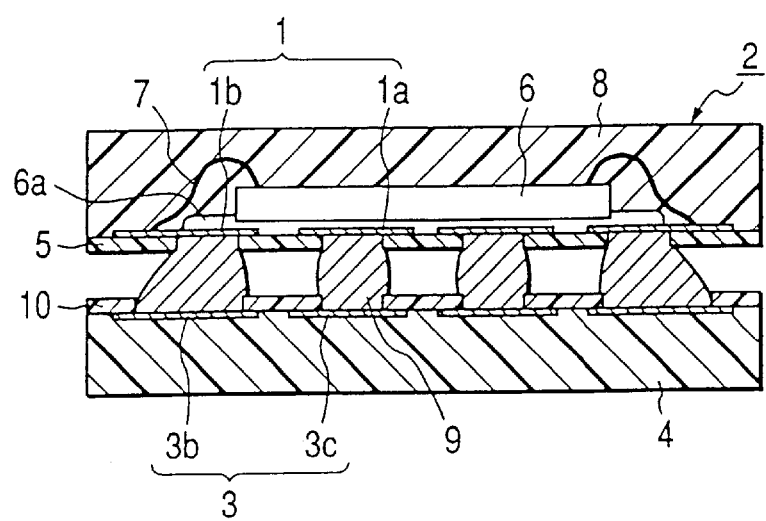
FIG. 24 is a sectional view taken along the line I—I in FIG. 23.

FIGS. 23 and 24 show the ninth embodiment of this invention. In this embodiment, the major axis of the elliptical shape of each non-corner outermost electrode 3c is parallel to a radial direction from a center "O" of a BGA package 2, that is, parallel to the line connecting the center "O" of the BGA package 2 and the center of the elliptical shape of the non-corner outermost electrode 3c.

According to this embodiment, solder bumps 9 connecting the electrodes 3 on the multiple-layer printed circuit board 4 and the electrodes 1 on the BGA package 2 have a longer life time. In addition, the solder bumps 9 effectively withstand stresses in radial directions from the center "O" of the BGA package 2.

Tenth Embodiment

A tenth embodiment of this invention is similar to the first embodiment thereof except for shapes of non-corner outermost electrodes 3c on a multiple-layer printed circuit board 4.

Figure 25:
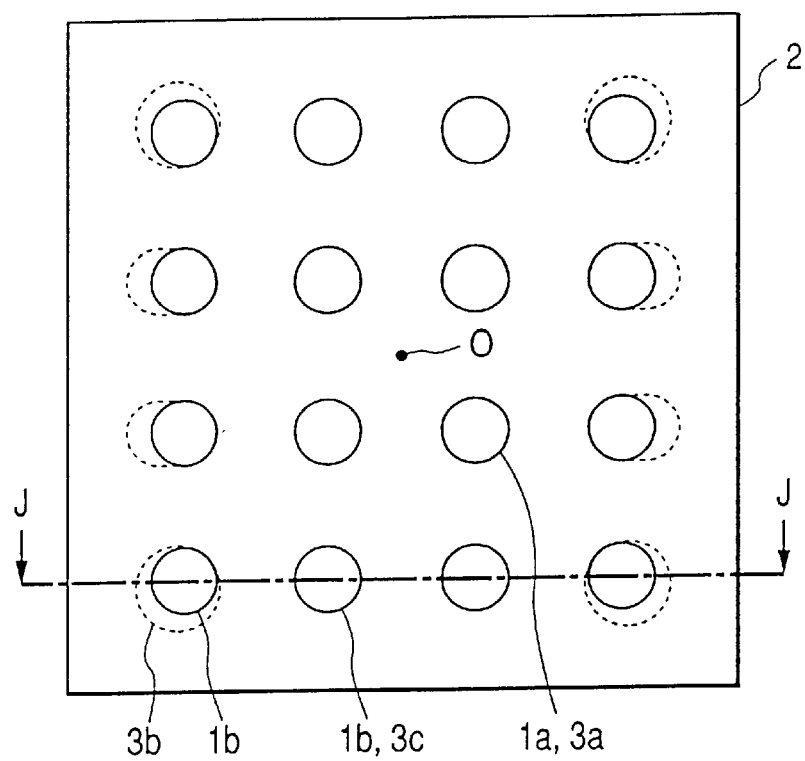
FIG. 25 is a plan view of electrodes on a BGA package and electrodes on a multiple-layer printed circuit board in an electronic-component mounting structure according to a tenth embodiment of this invention.
Figure 26:
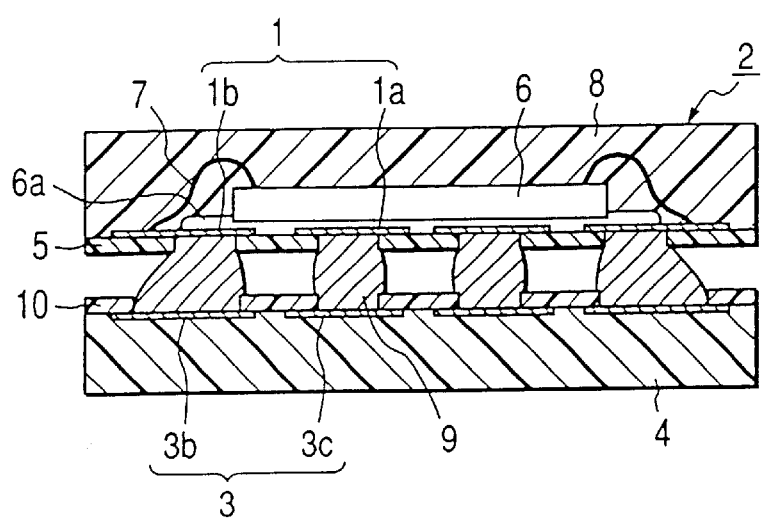
FIG. 26 is a sectional view taken along the line J—J in FIG. 25.

FIGS. 25 and 26 show the tenth embodiment of this invention. In this embodiment, non-corner outermost electrodes 3c on a multiple-layer circuit board 4 have circular shapes substantially equal to circular shapes of corresponding outermost electrodes 1b on a BGA package 2.

An outer edge of each corner electrode 3b on the multiple-layer printed circuit board 4 extends outward of an outer edge of the corresponding outermost electrode 1b on the BGA package 2 with respect to quadrilaterals of electrode arrays.

According to this embodiment, solder bumps 9 connecting the corner electrodes 3b on the multiple-layer printed circuit board 4 and the corresponding outermost electrodes 1b on the BGA package 2 have a longer life time.

Eleventh Embodiment

An eleventh embodiment of this invention is similar to the second embodiment thereof except for sizes of inner electrodes 3a on a multiple-layer printed circuit board 4.

Figure 27:
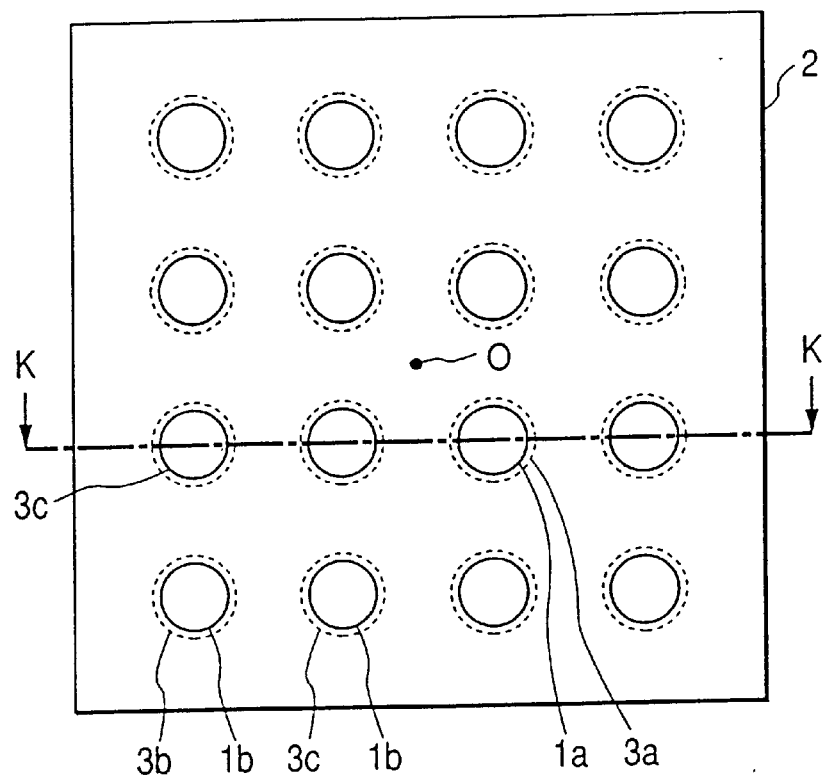
FIG. 27 is a plan view of electrodes on a BGA package and electrodes on a multiple-layer printed circuit board in an electronic-component mounting structure according to an eleventh embodiment of this invention.
Figure 28:
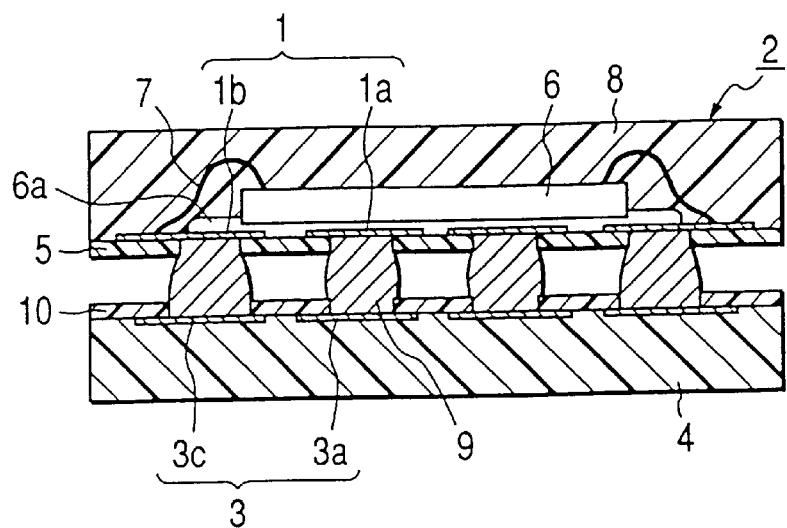
FIG. 28 is a sectional view taken along the line K—K in FIG. 27.

FIGS. 27 and 28 show the eleventh embodiment of this invention. In this embodiment, inner electrodes 3a on a multiple-layer circuit board 4 have circular shapes greater than circular shapes of corresponding inner electrodes 1a on a BGA package 2.

An outer edge of each inner electrode 3a on the multiple-layer printed circuit board 4 extends outward of an outer edge of the corresponding inner electrode 1a on the BGA package 2 with respect to quadrilaterals of electrode arrays.

According to this embodiment, solder bumps 9 connecting the inner electrodes 3a on the multiple-layer printed circuit board 4 and the corresponding inner electrodes 1a on the BGA package 2 have a longer life time.

Twelfth Embodiment

A twelfth embodiment of this invention is similar to one of the first embodiment to the eleventh embodiment thereof except that electrodes 3 on a multiple-layer printed circuit board 4 and electrodes 1 on a BGA package 2 have shapes different from elliptical shapes and circular shapes.

In the twelfth embodiment of this invention, an outer edge of each electrode 3 on the multiple-layer printed circuit board 4 extends outward of an outer edge of the corresponding electrode 1 on the BGA package 2 with respect to quadrilaterals of electrode arrays.

Thirteenth Embodiment

A thirteenth embodiment of this invention is similar to one of the first embodiment and the third embodiment to the ninth embodiment thereof except for arrangements of outermost electrodes 3b and 3c on a multiple-layer printed circuit board 4.

Figure 29:
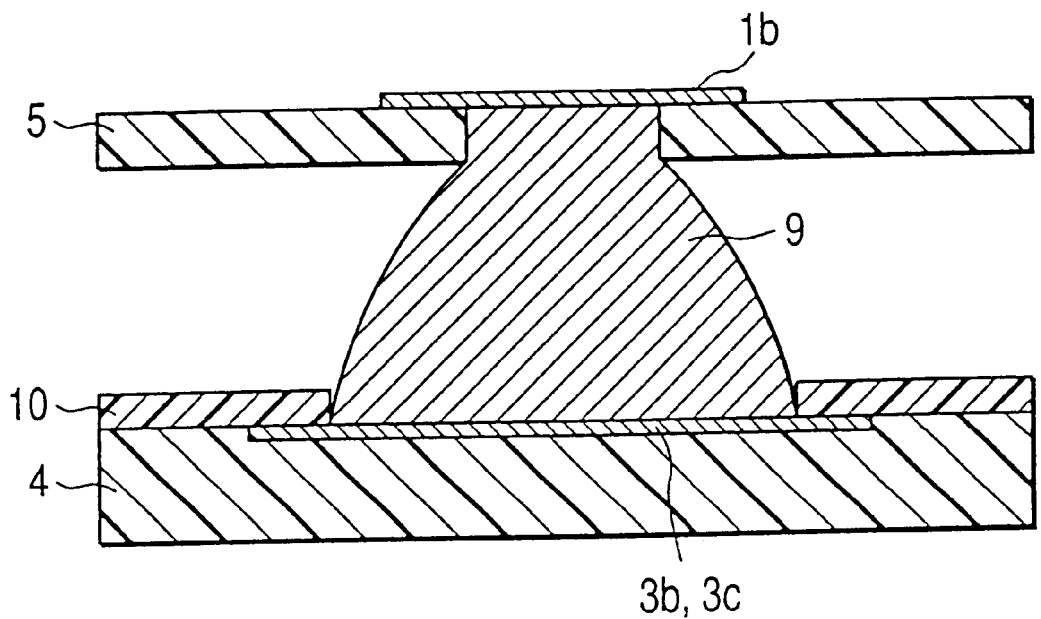
FIG. 29 is a sectional view of an outermost electrode on a multiple-layer printed circuit board, a corresponding outermost electrode on a BGA package, and a corresponding solder bump in an electronic-component mounting structure according to a thirteenth embodiment of this invention.
Figure 30:
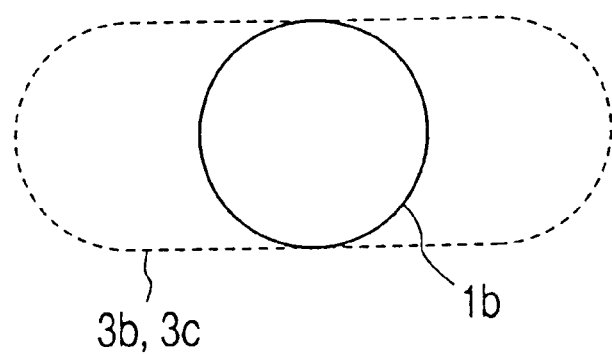
FIG. 30 is a plan view of the outermost electrode on the multiple-layer printed circuit board, and the corresponding outermost electrode on the BGA package in FIG. 29.

FIGS. 29 and 30 show a portion of the thirteenth embodiment of this invention. In this embodiment, each outermost electrode 3b or 3c on a multiple-layer printed circuit board 4 has an elliptical shape in which a circular shape of a corresponding outermost electrode 1b on a BGA package 2 is contained as viewed from above (see FIG. 30). The center of each outermost electrode 1b on the BGA package 2 vertically aligns with the center of the corresponding outermost electrode 3b or 3c on the multiple-layer circuit board 4.

Fourteenth Embodiment

A fourteenth embodiment of this invention is similar to one of the first embodiment and the third embodiment to the ninth embodiment thereof except for arrangements of outermost electrodes 3b and 3c on a multiple-layer printed circuit board 4.

Figure 31:
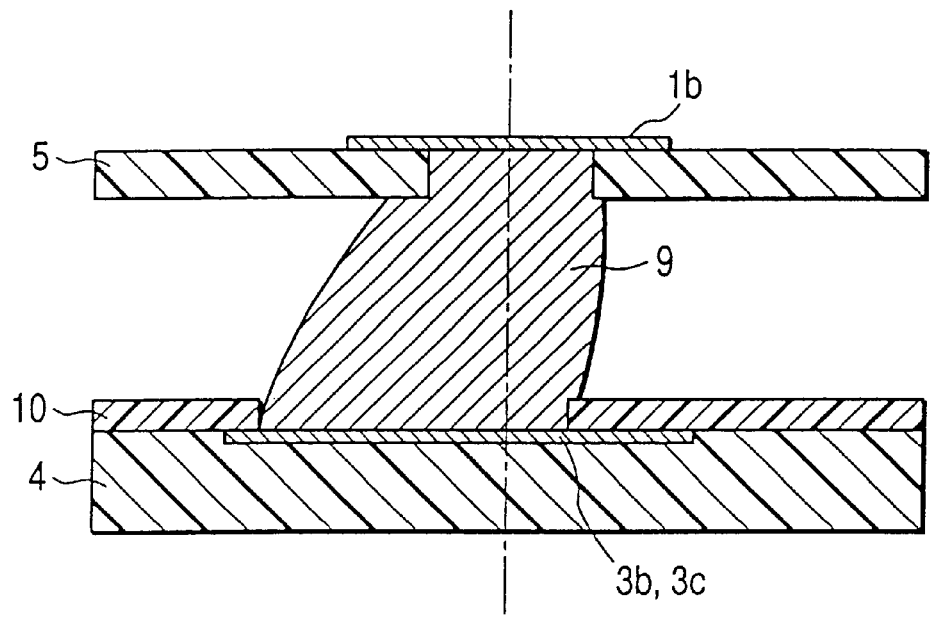
FIG. 31 is a sectional view of an outermost electrode on a multiple-layer printed circuit board, a corresponding outermost electrode on a BGA package, and a corresponding solder bump in an electronic-component mounting structure according to a fourteenth embodiment of this invention.
Figure 32:
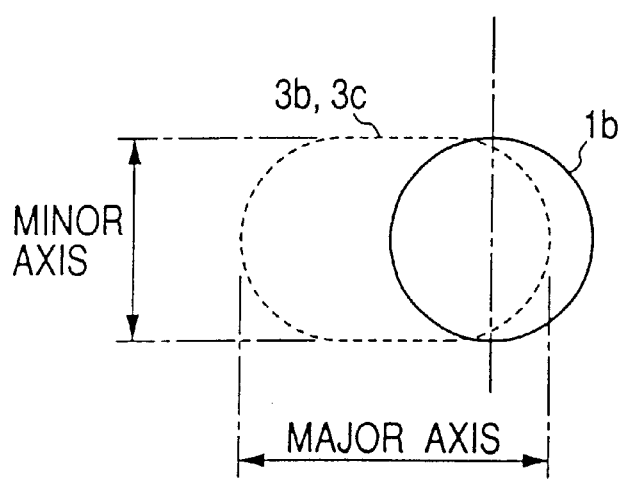
FIG. 32 is a plan view of the outermost electrode on the multiple-layer printed circuit board, and the corresponding outermost electrode on the BGA package in FIG. 31.
Figure 33:
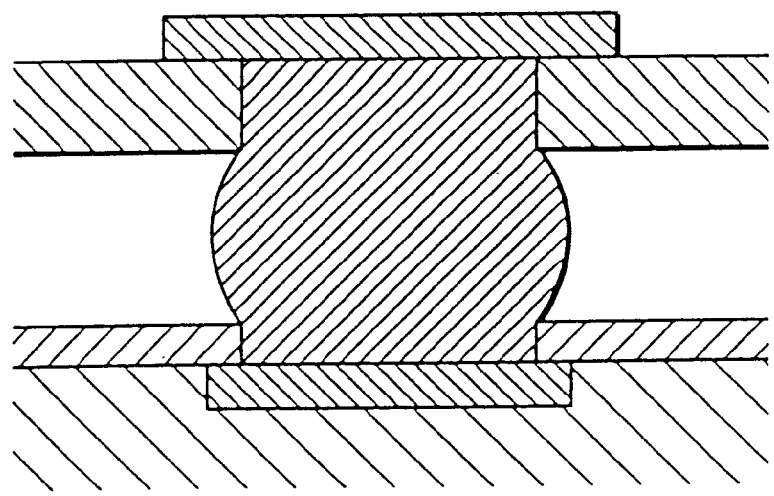
FIG. 33 is a sectional view of an interconnecting solder bump having a barrel-like shape.
Figure 34:
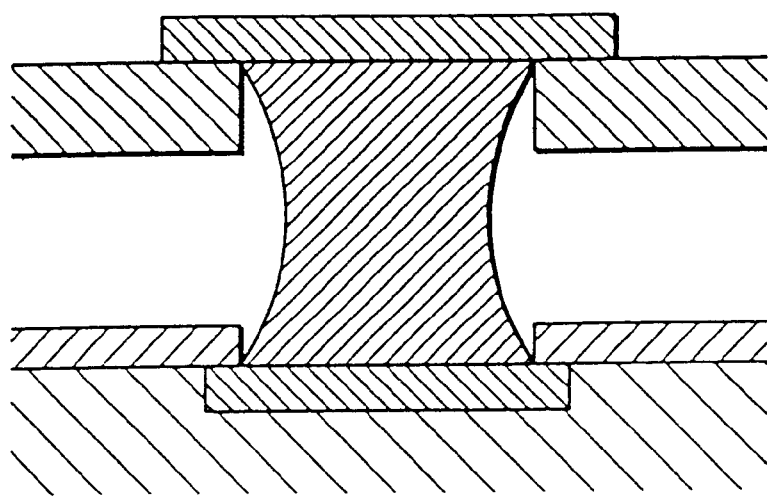
FIG. 34 is a sectional view of an interconnecting solder bump having a drum-like shape with a constricted middle portion.

FIGS. 31 and 32 show a portion of the fourteenth embodiment of this invention. In this embodiment, each outermost electrode 3b or 3c on a multiple-layer printed circuit board 4 has an elliptical shape out of which a circular shape of a corresponding outermost electrode 1b on a BGA package 2 extends (see FIG. 32). In other words, the elliptical shape of each outermost electrode 3b on the multiple-layer printed circuit board 4 overlaps partially with the circular shape of a corresponding outermost electrode 1b on the BGA package 2.

Fifteenth Embodiment

A fifteenth embodiment of this invention is similar to the fourth embodiment thereof except for directions of inner electrodes 3a on a multiple-layer printed circuit board 4 which are off the diagonal lines of a quadrilateral of a related electrode array.

In the fifteenth embodiment, the major axis of an elliptical 10 shape of each of these inner electrodes 3a is parallel to a radial direction from a center "O" of a BGA package 2, that is, parallel to the line connecting the center "O" of the BGA package 2 and the center of the elliptical shape of the electrode 3a.

Sixteenth Embodiment

A sixteenth embodiment of this invention is similar to one of the fifth and seventh embodiments thereof except for shapes of inner electrodes 3a on a multiple-layer printed circuit board 4.

In the sixteenth embodiment, inner electrodes 3a on a multiple-layer printed circuit board 4 have circular shapes greater than circular shapes of inner electrodes 1a on a BGA package 2.

What is claimed is:

1. An electronic-component mounting structure comprising:
   an electronic component (2) having a surface;
   first electrodes (1) provided on the surface of the electronic component (2) and arranged in a first array;
   a base board (4);
   second electrodes (3) provided on the base board (4) and arranged in a second array corresponding to the first array, the second electrodes (3) corresponding to the first electrodes (1) respectively; and
   solder bumps (9) connecting the first electrodes (1) and the second electrodes (3) respectively;
   wherein the first electrodes (1) include first outermost electrodes (1b) located in an outer area of the first array, and the second electrodes (3) include second outermost electrodes (3b, 3c) located in an outer area of the second array, the second outermost electrodes (3b, 3c) corresponding to the first outermost electrodes (1b) respectively;
   wherein an outer edge (X1, Z1) of each of the second outermost electrodes (3b, 3c) extends outward of an outer edge (Y1) of a corresponding first outermost electrode (1b) with respect to the first and second arrays; and
   wherein a distance between an outer edge (X1, Z1) of each of the second outermost electrodes (3b, 3c) and an outer edge (Y1) of a corresponding first outermost electrode (1b) is greater than a distance between an inner edge (X2, Z2) of the second outermost electrode (3b, 3c) and an inner edge (Y2) of the corresponding first outermost electrode (1b) with respect to the first and second arrays.

2. An electronic-component mounting structure as set forth in claim 1, wherein the second electrodes (3) have greater areas of bond to the solder bumps (9) than areas of bond between the first electrodes (1) and the solder bumps (9).

3. An electronic-component mounting structure as set forth in claim 1, wherein the second outermost electrodes (3b, 3c) include electrodes (3c) having elliptical shapes whose major axes are perpendicular to a related side of a polygon formed by the second array.

4. An electronic-component mounting structure as set forth in claim 1, wherein the second outermost electrodes (3b, 3c) include corner electrodes (3b) located in corners of the second array respectively, and a center of each of the corner electrodes (3b) extends radially outward of a center of a corresponding first outermost electrode (1b) with respect to centers of the first and second arrays.

5. An electronic-component mounting structure as set forth in claim 4, wherein each of the corner electrodes (3b) has a circular shape greater in area than a corresponding first outermost electrode (1b).

6. An electronic-component mounting structure as set forth in claim 4, wherein each of the corner electrodes (3b) has an elliptical shape whose major axis is parallel to a radial direction from the centers of the first and second arrays.

7. An electronic-component mounting structure as set forth in claim 1, wherein the second outermost electrodes (3b, 3c) include electrodes (3b, 3c) having elliptical shapes whose major axes are parallel to respective radial directions from centers of the first and second arrays.

8. An electronic-component mounting structure as set forth in claim 1, wherein an inner edge (X2, Z2) of each of the second outermost electrodes (3b, 3c) extends outward of an inner edge (Y2) of a corresponding first outermost electrode (1b) with respect to the first and second arrays.

9. An electronic-component mounting structure as set forth in claim 1, wherein the second electrodes (3) include inner electrodes (3a) extending inward of the second outermost electrodes (3b, 3c) with respect to the second array, and the inner electrodes (3a) are substantially equal in size to corresponding first electrodes (1).

10. An electronic-component mounting structure as set forth in claim 1, wherein the second electrodes (3) include inner electrodes (3a) extending inward of the second outermost electrodes (3b, 3c) with respect to the second array, and the inner electrodes (3a) are greater in area than corresponding first electrodes (1), and wherein an outer edge of each of the inner electrodes (3a) extends outward of an outer edge of a corresponding first electrode (1) with respect to the first and second arrays.

11. An electronic-component mounting structure as set forth in claim 10, wherein the inner electrodes (3a) have elliptical shapes.

12. An electronic-component mounting structure as set forth in claim 11, wherein major axes of the elliptical shape of each of the inner electrodes (3a) are parallel to respective radial directions from centers of the first and second arrays.

13. An electronic-component mounting structure as set forth in claim 11, wherein a major axis of the elliptical shape of each of the inner electrodes (3a) increases as the inner electrode is remoter from centers of the first and second arrays.

14. An electronic-component mounting structure as set forth in claim 1 which is used in a portable electronic apparatus.

15. An electronic-component mounting structure comprising:
   an electronic component (2) having a surface;
   first electrodes (1) provided on the surface of the electronic component (2) and arranged in a first array;
   a base board (4);
   second electrodes (3) provided on the base board (4) and arranged in a second array corresponding to the first array, the second electrodes (3) corresponding to the first electrodes (1) respectively; and
   solder bumps (9) connecting the first electrodes (1) and the second electrodes (3) respectively;
   wherein the first electrodes (1) include first outermost electrodes (1b) located in an outer area of the first array, and the second electrodes (3) include second outermost electrodes (3b, 3c) located in an outer area of the second array, the second outermost electrodes (3b, 3c) corresponding to the first outermost electrodes (1b) respectively; and
   wherein an angle ($\theta 1$) between a surface of each of the second outermost electrodes (3b, 3c) and a surface of a corresponding solder bump (9) at an outer edge (X1, Z1) of the second outermost electrode (3b, 3c) is acute, and is different from an angle ($\theta 2$) between a surface of the second outermost electrode (3b, 3c) and a surface of the corresponding solder bump (9) at an inner edge (X2, Z2) of the second outermost electrode (3b, 3c) with respect to the first and second arrays.

16. An electronic-component mounting structure as set forth in claim 15, wherein the first electrodes (1) have a greater strength of bond to the solder bumps (9) than a strength of bond between the second electrodes (3) and the solder bumps (9).

17. An electronic-component mounting structure comprising:

an electronic component (2) having a surface;

first electrodes (1) provided on the surface of the electronic component (2) and arranged in a first array;

a base board (4);

second electrodes (3) provided on the base board (4) and arranged in a second array corresponding to the first array, the second electrodes (3) corresponding to the first electrodes (1) respectively; and solder bumps (9) connecting the first electrodes (1) and the second electrodes (3) respectively;

wherein the cross-sectional diameter of the solder bumps (9) increases continuously from the first electrodes (1) toward the second electrodes (3);

wherein the first electrodes (1) have a greater strength of bond to the solder bumps (9) than a strength of bond between the second electrodes (3) and the solder bumps (9);

wherein the first electrodes (1) include first outermost electrodes (1b) located in an outer area of the first array, and the second electrodes (3) include second outermost electrodes (3b, 3c) located in an outer area of the second array, the second outermost electrodes (3b, 3c) corresponding to the first outermost electrodes (1b) respectively; and wherein an outer edge (X1, Z1) of each of the second outermost electrodes (3b, 3c) extends outward of an outer edge (Y1) of a corresponding first outermost electrode (1b) with respect to the first and second arrays.

18. An electronic-component mounting structure comprising:

an electronic component (2) having a surface;

first electrodes (1) provided on the surface of the electronic component (2) and arranged in a first array;

a base board (4);

second electrodes (3) provided on the base board (4) and arranged in a second array corresponding to the first array, the second electrodes (3) corresponding to the first electrodes (1) respectively; and solder bumps (9) connecting the first electrodes (1) and the second electrodes (3) respectively;

wherein the cross-sectional diameter of the solder bumps (9) increases continuously from the first electrodes (1) toward the second electrodes (3);

wherein ones of the first electrodes (1) and the second electrodes have a greater strength of bond to the solder bumps (9) than a strength of bond between others and the solder bumps (9);

wherein the first electrodes (1) include first outermost electrodes (1b) located in an outer area of the first array, and the second electrodes (3) include second outermost electrodes (3b, 3c) located in an outer area of the second array, the second outermost electrodes (3b, 3c) corresponding to the first outermost electrodes (1b) respectively; and wherein an outer edge of each of ones of the first outermost electrodes (1b) and the second outermost electrodes (3b, 3c) extends outward of an outer edge (Y1) of a corresponding one of the first outermost electrodes (1b ) and the second outermost electrodes (3b, 3c) with respect to the first and second arrays.

* * * * *